(12) United States Patent
Bouche et al.

(10) Patent No.: US 12,512,407 B2
(45) Date of Patent: Dec. 30, 2025

(54) STITCHING TO ENABLE DENSE INTERCONNECT ARRANGEMENTS

(71) Applicant: Intel NDTM US LLC, Rancho Cordova, CA (US)

(72) Inventors: Guillaume Bouche, Portland, OR (US); Andy Chih-Hung Wei, Yamhill, OR (US)

(73) Assignee: Intel NDTM US LLC, Rancho Cordova, CA (US)

( * ) Notice: Subject to any disclaimer, the term of this patent is extended or adjusted under 35 U.S.C. 154(b) by 1202 days.

(21) Appl. No.: 17/080,880

(22) Filed: Oct. 27, 2020

(65) Prior Publication Data

US 2022/0130758 A1 Apr. 28, 2022

(51) Int. Cl.
*H01L 23/528* (2006.01)
*H01L 21/768* (2006.01)
*H01L 23/535* (2006.01)

(52) U.S. Cl.
CPC .... *H01L 23/5283* (2013.01); *H01L 21/76897* (2013.01); *H01L 23/535* (2013.01)

(58) Field of Classification Search
CPC ............... H01L 23/535; H01L 23/5283; H01L 21/76897; H01L 23/528; H01L 23/48–52; H01L 21/0334; H01L 21/76895
See application file for complete search history.

(56) References Cited

U.S. PATENT DOCUMENTS

| | | | | |
|---|---|---|---|---|
| 6,030,752 A | * | 2/2000 | Fulford, Jr. | G03F 7/70475 430/394 |
| 8,969,199 B1 | * | 3/2015 | Yuan | H01L 21/31144 438/666 |
| 11,107,731 B1 | * | 8/2021 | Xie | H01L 23/5226 |
| 2010/0123250 A1 | * | 5/2010 | Schulz | H01L 21/027 257/773 |
| 2011/0096309 A1 | * | 4/2011 | Paul Wiaux | G03F 7/70475 355/40 |
| 2012/0086128 A1 | * | 4/2012 | Ponoth | H01L 21/76885 257/E21.583 |

(Continued)

FOREIGN PATENT DOCUMENTS

TW 201438134 A 10/2014

*Primary Examiner* — Yara B Green
*Assistant Examiner* — Coralie A Nettles
(74) *Attorney, Agent, or Firm* — Haley Guiliano LLP

(57) ABSTRACT

Methods for fabricating interconnect arrangements of a metallization layer Mx by using stitching that is enabled by subtractive metallization are disclosed. An example method includes providing a metal layer and a collection layer over the metal layer. The method then includes forming openings for two sets of metal lines by performing a first lithographic process to provide, in the collection layer, first openings for a first set of lines, and then performing a second lithographic process to provide, in the collection layer, second openings for a second set of lines. The method further includes performing a third lithographic process to provide a further opening (a stitch opening) that overlaps with at least one of the first openings of a first track and at least one of the second openings of a second track, and, finally, transferring the pattern of the first, second, and stitch openings to the metal layer.

19 Claims, 22 Drawing Sheets

(56) References Cited

U.S. PATENT DOCUMENTS

| | | | |
|---|---|---|---|
| 2014/0035151 A1* | 2/2014 | Yuan | G03F 7/70466 |
| | | | 257/E23.079 |
| 2015/0214085 A1 | 7/2015 | Jin et al. | |
| 2015/0287604 A1* | 10/2015 | Stephens | H10D 84/038 |
| | | | 438/587 |

* cited by examiner

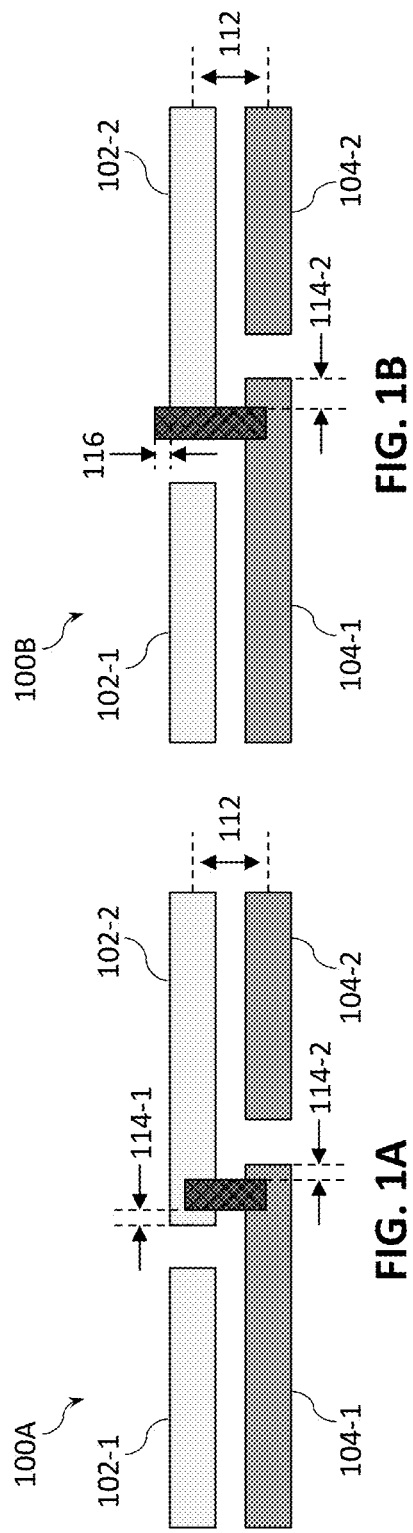
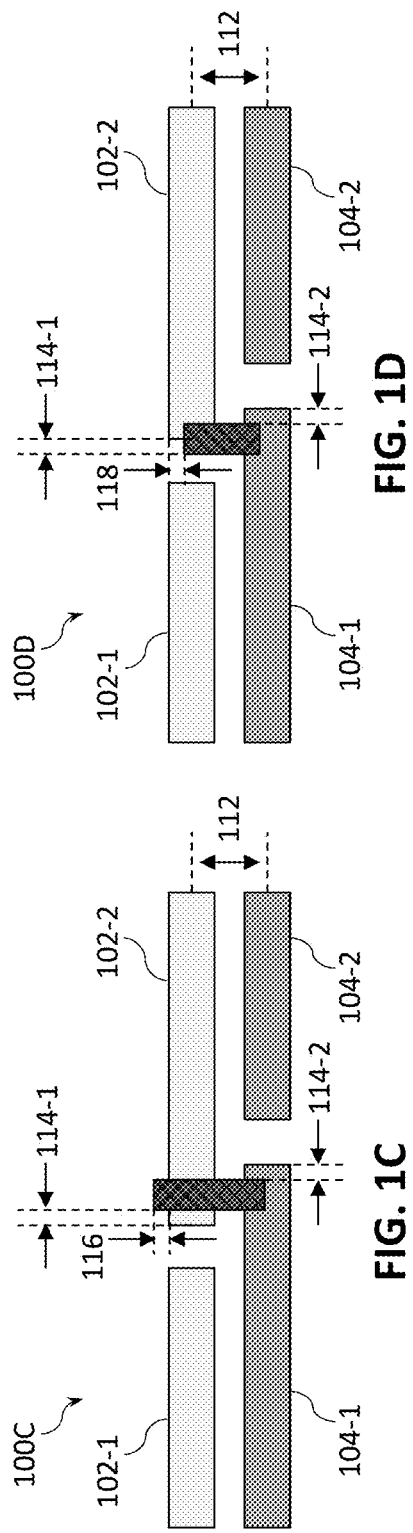
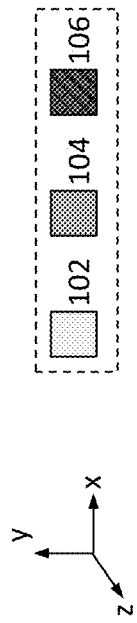

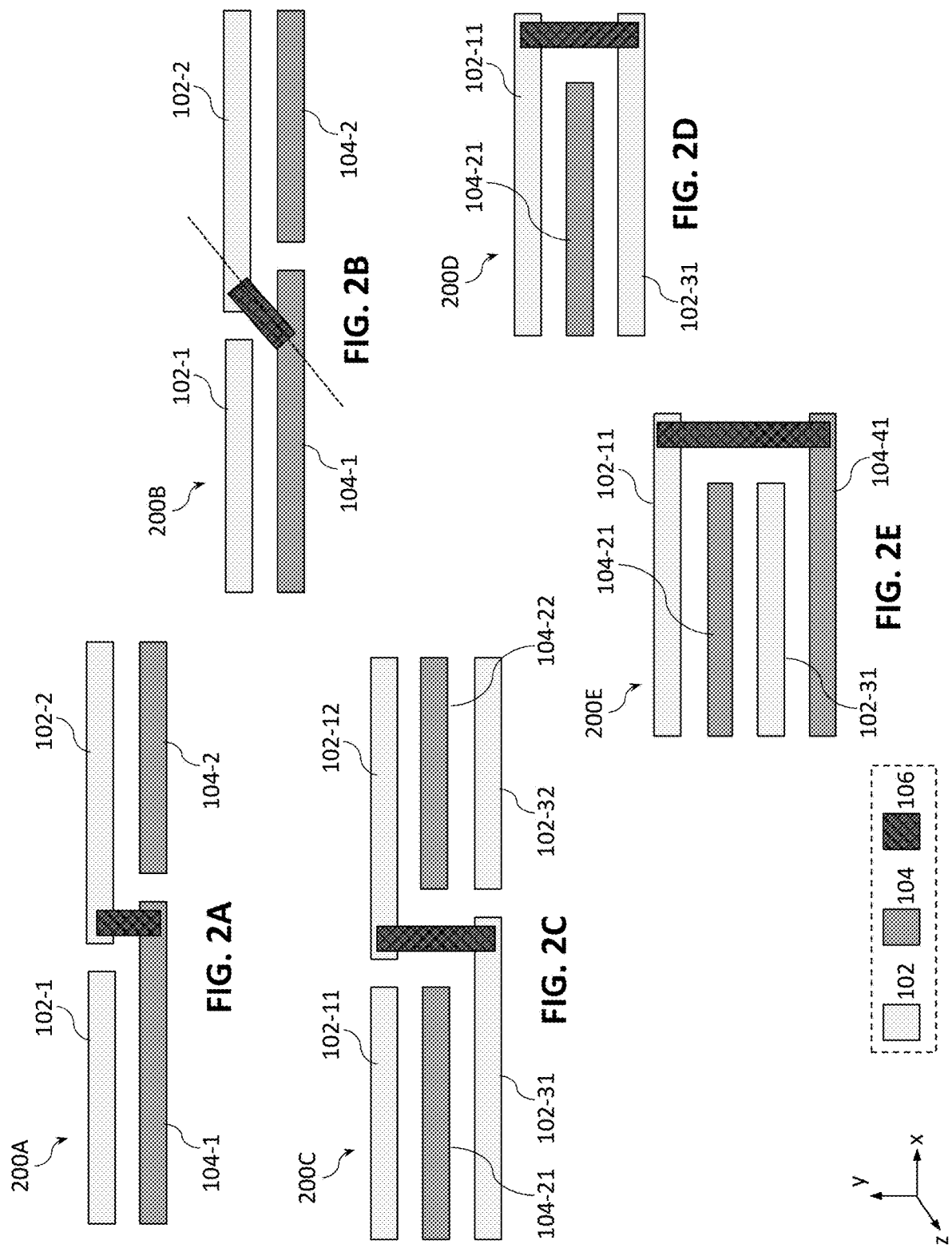

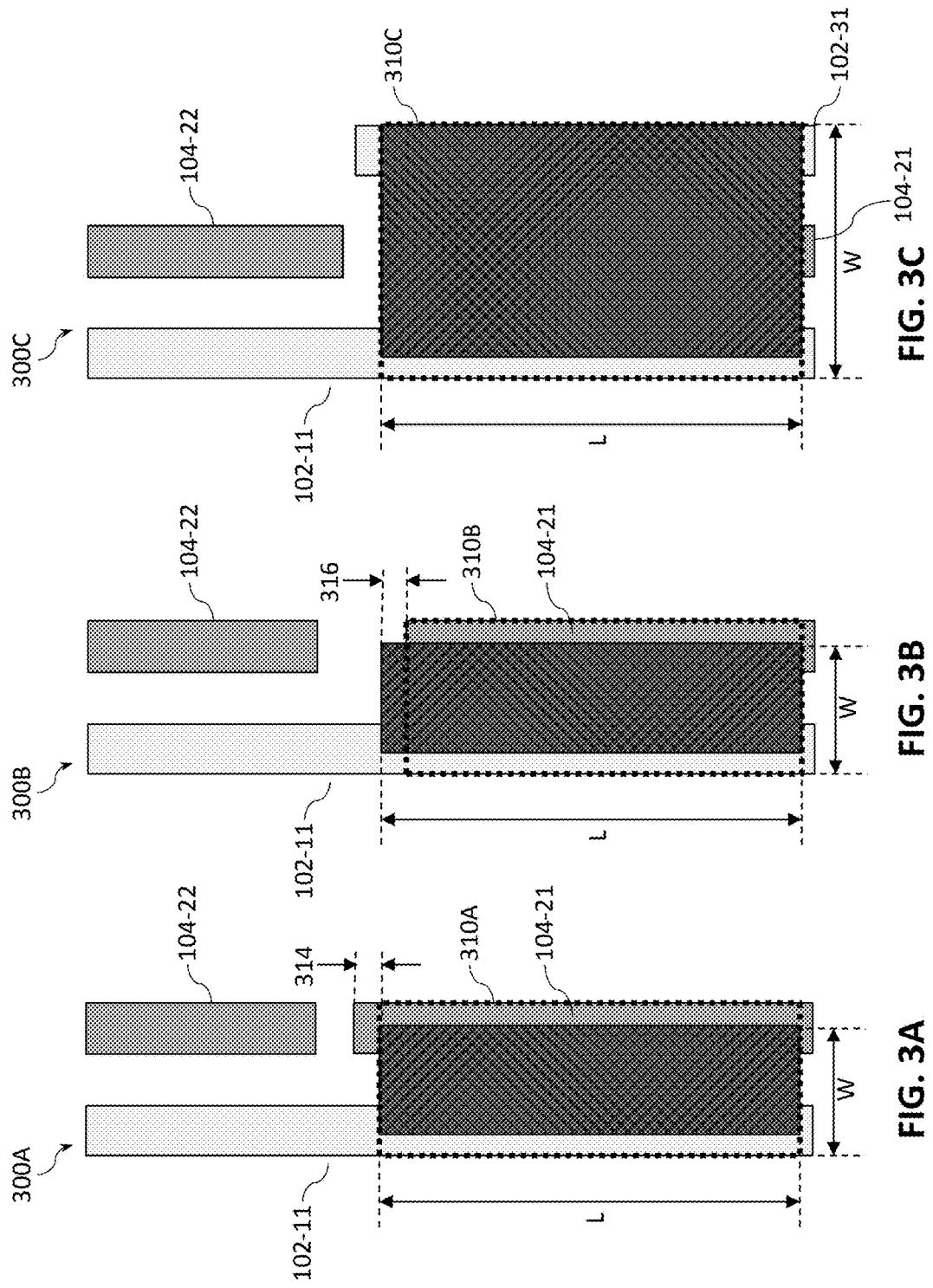

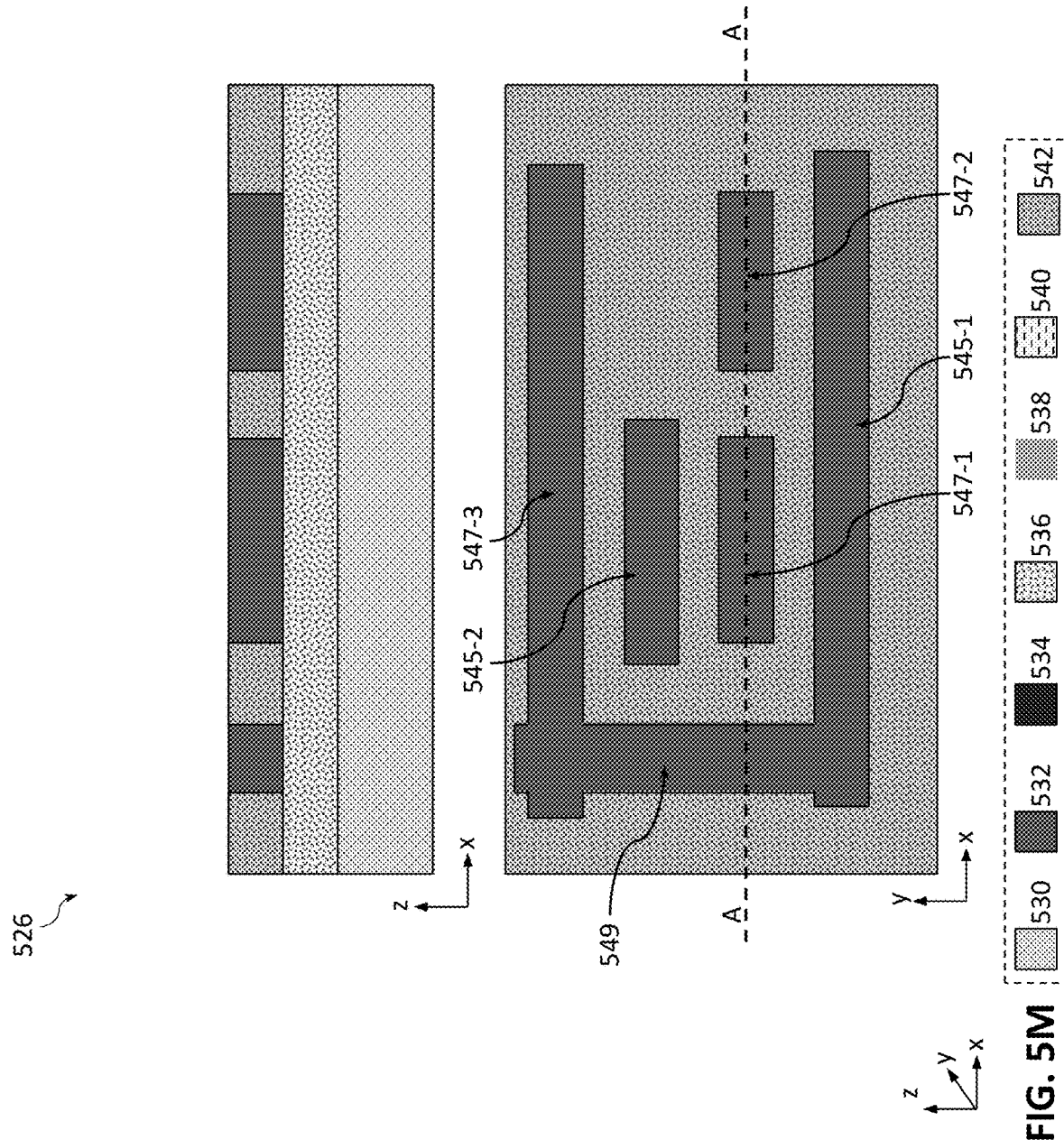

STITCHING TO ENABLE DENSE INTERCONNECT ARRANGEMENTS

TECHNICAL FIELD

This disclosure relates generally to the field of semiconductor devices, and more specifically, to metallization stacks with integrated vias.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 1A-1D illustrate top-down views of example interconnect arrangements of integrated circuit (IC) structures where stitching resulted in different types of misalignments, in accordance with some embodiments.

FIGS. 2A-2E illustrate top-down views of example interconnect arrangements of IC structures where stitching was performed in different orientations and across different number of tracks, in accordance with some embodiments.

FIGS. 3A-3C illustrate top-down views of example interconnect arrangements of IC structures where stitching was performed to increase widths of at least portions of the tracks, in accordance with some embodiments.

FIGS. 5A-5M illustrate top-down and cross-sectional side views at various stages in the manufacture of an example IC structure according to the method of FIG. 4, in accordance with some embodiments.

DETAILED DESCRIPTION

Overview

Figure 4A:
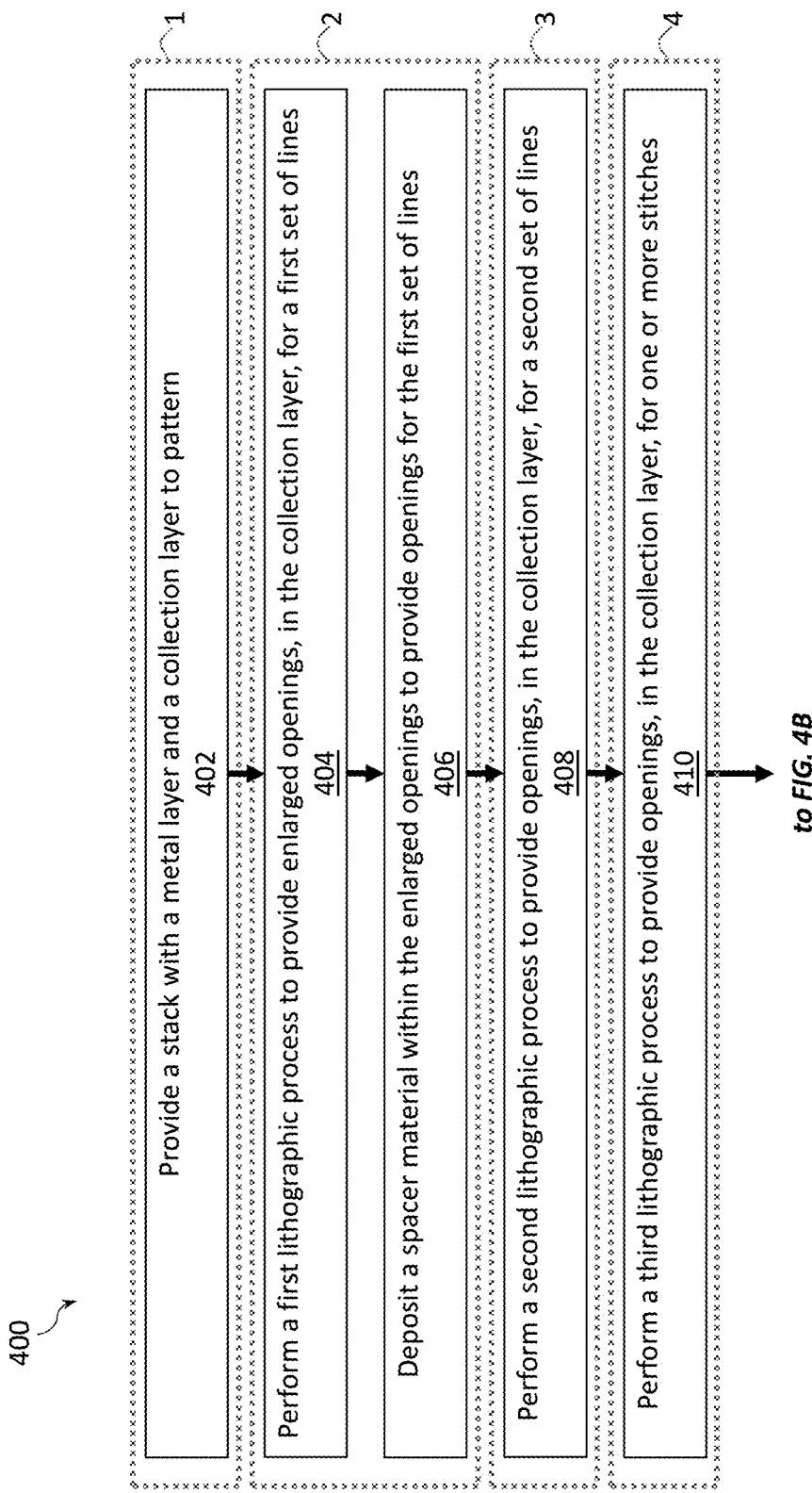
FIG. 4 provides a flow diagram of an example method of using stitching, in accordance with some embodiments.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating stitching to enable dense interconnect arrangements as described herein it might be useful to first understand phenomena that may come into play during IC fabrication. The following foundational information may be viewed as a basis from which the present disclosure may be properly explained. Such information is offered for purposes of explanation only and, accordingly, should not be construed in any way to limit the broad scope of the present disclosure and its potential applications.

ICs commonly include electrically conductive microelectronic structures, known in the art as interconnects, to provide electrical connectivity between various components. In this context, the term "metallization stack" may be used to describe a stacked series of layers of electrically conductive wires (sometimes referred to as "metal lines") which are electrically insulated from one another except for when/where they may need to be electrically connected. In a typical metallization stack, a given layer of a metallization stack includes a plurality of metal lines substantially parallel to one another, while electrical connections between metal lines of different layers of a metallization stack are realized by means of vias filled with one or more electrically conductive materials, extending in a direction substantially perpendicular to the planes of the metal lines (i.e., extending in a vertical direction if the plane of the metal lines is considered to be a horizontal plane).

Different layers of a metallization stack are sometimes referred to using the notation "Mx" for a given layer, where the metallization layer below it is referred to as "Mx−1" and the metallization layer above it is referred to as "Mx+1." In a given metallization layer Mx, the term "track" refers to a single direction or a single line along which one or more metal lines may be provided. A typically metallization layer includes a plurality of tracks which are substantially parallel to one another, each track containing one or more metal lines.

In the past, the sizes and the spacing of interconnects such as metal lines have progressively decreased, and it is expected that in the future the sizes and the spacing of the interconnects will continue to progressively decrease, for at least some types of ICs (e.g., advanced microprocessors, chipset components, graphics chips, etc.). One measure of a size of a metal line is the critical dimension of the line width. One measure of the spacing of the metal lines is the line pitch (or "track pitch"), representing the center-to-center distance between the closest adjacent metal lines (i.e., between closes adjacent tracks) of a given layer of a metallization stack.

Smaller and smaller sizes and spacing of interconnects demands that performance of every interconnect is optimized. In this context, the term "jog" refers to an electrical connection between metal lines of different tracks of a given metallization layer that is contained within the layer, while the term "metal upsizing" refers to increasing the width of a given metal line. Jogs are helpful to enable dense cell routing, while metal upsizing enables higher performance.

Introduction of jogs and upsizing capability at Mx level leads to color-aware placement constraints for the Electronic Design Automation (EDA) tools, where the term "color" is referred to a given instance of a lithographic exposure during manufacturing of an interconnect arrangement. Color-aware placement constraints for the EDA tools adds complexity and reduces routing efficiency. In addition, jogs introduce further complexity in that sometimes jogs are not allowed due to design or manufacturing capabilities, meaning that an electrical connection between metal lines of different tracks of a given metallization layer Mx cannot be contained within said layer and must, therefore, be made either by means of an underpass or an overpass. An underpass provides the electrical connection using a metal bridge at Mx−1, connected by vias to the metal lines of two different tracks of the layer Mx. An overpass provides the electrical connection using a metal bridge at Mx+1, connected by vias to the metal lines of two different tracks of the layer Mx. Underpasses and overpasses create undesirable congestion at Mx−1 and Mx+1 layers.

Disclosed herein are methods for fabricating IC structures, e.g., for fabricating interconnect arrangements of a given layer Mx of metallization stacks of IC structures, by using stitching enabled by subtractive metallization, as well as related semiconductor devices (e.g., the interconnect arrangements at Mx resulting from the use of stitching, as well as various devices that may include one or more of such interconnect arrangements). An example method includes providing, over a support structure (e.g., a substrate, a wafer, or a chip), a stack that includes at least a metal layer and a collection layer, so that the metal layer is between the support structure and the collection layer. The method then includes performing a 2-color process of forming openings for two sets of metal lines by performing a first lithographic process (i.e., the first color) to provide, in the collection layer, first openings for a first set of lines, and then performing a second lithographic process (i.e., the second color) to provide, in the collection layer, second openings for a second set of lines. The method further includes performing a third lithographic process to provide, in the collection layer, at least one further opening (a third opening, referred to herein as a "stitch opening") that overlaps with at least one of the first openings of a first track and at least one of the second openings of a second track and, finally, transferring the pattern of the first, second, and stitch openings to the metal layer. Once transferred to the metal layer of Mx, the pattern of the first openings results in metal lines that have locations and geometry defined by the first openings, and the pattern of the second openings results in metal lines that have locations and geometry defined by the second openings. The stitch opening results in an electrical connection that may be referred to as a "stitch" between two metal lines of different tracks of Mx. Such a stitch may form a jog or realize metal upsizing. In such a method, a third mask may be used in combination with a 2-color process to form jogs or perform upsizing in a manner that enables dense interconnect arrangements at Mx, reduces or minimizes congestion in upper or lower metal layers of a metallization stack, and reduces or minimizes complexity at cell placement required from EDA tools to manage coloring. Additionally, electromigration risk due to overlay-induced stubs at line ends and associated metal filling voiding are advantageously reduced with a subtractive metal patterning process. It should be noted that, although various interconnects may be described herein as metal interconnects (e.g., metal lines, or a metal stitch), these interconnects may be formed, or include, electrically conductive materials other than metals.

IC structures as described herein, in particular interconnect arrangements where stitching was used to enable dense interconnect arrangements as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 6A-6B, such a collection may be referred to herein without the letters, e.g., as "FIG. 6."

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of one or more interconnect arrangements where stitching was used as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, some descriptions may refer to a particular source or drain region or contact being either a source region/contact or a drain region/contact. However, unless specified otherwise, which region/contact of a transistor is considered to be a source region/contact and which region/contact is considered to be a drain region/contact is not important because under certain operating conditions, designations of source and drain are often interchangeable. Therefore, descriptions provided herein may use the term of a "S/D region/contact" to indicate that the region/contact can be either a source region/contact, or a drain region/contact.

In another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

In yet another example, a term "interconnect" may be used to describe any element formed of an electrically conductive material for providing electrical connectivity to one or more components associated with an IC or/and between various such components. In general, the "interconnect" may refer to both trench contacts (also sometimes referred to as "lines") and vias. In general, a term "trench contact" may be used to describe an electrically conductive element isolated by a dielectric material typically comprising an interlayer low-k dielectric that is provided within the plane of an IC chip. Such trench contacts are typically stacked into several levels, or several layers of metallization stacks. On the other hand, the term "via" may be used to describe an electrically conductive element that interconnects two or more trench contacts of different levels. To that end, a via may be provided substantially perpendicularly to the plane of an IC chip and may interconnect two trench contacts in adjacent levels or two trench contacts in not adjacent levels. A term "metallization stack" may be used to refer to a stack of one or more interconnects for providing connectivity to different circuit components of an IC chip.

Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Example Interconnect Arrangements Formed Using Stitching

Using stitching as described herein results in various unique arrangements of interconnect arrangements of metal lines and stitches in a metallization layer Mx of an IC structure. Some of these are illustrated in FIGS. 1A-1D, FIGS. 2A-2E, and FIGS. 3A-3C. Each of these drawings shows a top-down view of an Mx interconnect arrangement of an IC structure (in particular, the view of an x-y plane of a reference coordinate system shown at the bottom left corner of each page of these drawings). Some elements referred to in the description of these drawings with reference numerals are illustrated in these figures with different patterns, with a legend showing the correspondence between the reference numerals and patterns being provided at the bottom of each drawing page containing these drawings. In particular, the legends illustrate that FIGS. 1A-1D, FIGS. 2A-2E, and FIGS. 3A-3C use one pattern to show metal lines 102 formed by a first lithographic process of the stitching process described herein (i.e., first metal lines 102), e.g., of the stitching process as described with reference to FIG. 4, another pattern to show metal lines 104 formed by a second lithographic process of the stitching process described herein (i.e., second metal lines 104), and a third pattern to show at least one stitch 106 that provides electrical coupling between at least two metal lines of two different tracks, the stitch formed by a third lithographic process of the stitching process described herein. Even if the first metal lines 102, the second metal lines 104, and the stitch(es) 106 are formed of the same electrically conductive material, their unique arrangements with respect to one another as, e.g., illustrated in FIGS. 1A-1D, FIGS. 2A-2E, and FIGS. 3A-3C will be detectable in the final IC structures, e.g., using SEM or TEM.

In some embodiments, performing a 2-color process for forming two sets of openings for two sets of metal lines of the stitching process described herein, e.g., as described with reference to FIG. 4, may be realized using a self-aligned process where the openings for the second metal lines 104 are self-aligned, at least with respect to certain dimensions/directions, with respect to the openings for the first metal lines 102. However, one or more stitch openings provided by performing a third lithographic process as described herein are not self-aligned with respect to the first or the second openings, resulting in misalignments between the stitch 106 and the metal lines 102 and/or 104 to which the stitch 106 is coupled to. Certain misalignments between the stitch and one or more of the metal lines to which the stitch is electrically coupled to may be indicative of the use of the stitching process as described herein. FIGS. 1A-1D illustrate top-down views of example interconnect arrangements of IC structures where stitching resulted in different types of misalignments, in accordance with some embodiments.

Each of FIGS. 1A-1D illustrates an interconnect arrangement where first metal lines 102-1 and 102-2 belong to one track and second metal lines 104-1 and 104-2 belong to another track, where the pitch between two closest adjacent tracks is illustrated as a pitch 112 (this pitch is also applicable to other drawings of the present disclosure, e.g., to FIGS. 2A-2E or to FIGS. 3A-3C). If the tracks are provided along different lines parallel to the x-axis of the example coordinate system shown (i.e., if for each of the metal lines 102, 104, a long axis of the line is aligned in a direction of the x-axis of the example coordinate system shown), then the pitch 112 is a dimension measured along the y-axis. In various embodiments, the pitch 112 may be between about 16 and 44 nanometers, including all values and ranges therein, e.g., between about 18 and 36 nanometers, or between about 18 and 28 nanometers.

Furthermore, each of FIGS. 1A-1D illustrates a metal stitch 106 that couples the first metal line 102-2 and the second metal line 104-1. In particular, a first end of the metal stitch 106 is a portion of the metal stitch 106 that overlaps with one of the two metal lines to which the metal stitch is coupled to (e.g., the first metal line 102-2), while a second end of the metal stitch 106 is a portion of the metal stitch 106 that overlaps with the other one of the two metal lines to which the metal stitch is coupled to (e.g., the second metal line 104-1). In other embodiments of the interconnect arrangements shown in FIGS. 1A-1D, the first metal line 102-1 and/or the second metal line 104-2 may be absent.

FIG. 1A illustrates an interconnect arrangement 100A where a misalignment 114-1 may be present between the first end of the metal stitch 106 and one end of the first metal line 102-2, which may be measured along the x-axis of the example coordinate system shown. In particular, the misalignment 114-1 may be such that the end of the first metal line 102-2 may extend beyond the sidewall of the first end of the metal stitch 106 that is closest to the end of the first metal line 102-2.

FIG. 1A further illustrates a misalignment 114-2 that may be present between the second end of the metal stitch 106 and one end of the second metal line 104-1, which may also be measured along the x-axis of the example coordinate system shown. In particular, the misalignment 114-2 may be such that the end of the second metal line 104-1 may extend beyond the sidewall of the second end of the metal stitch 106 that is closest to the end of the second metal line 104-1.

Thus, the misalignments 114-1 and 114-2 are shown in FIG. 1A between respective sidewalls of the stitch 106 and the ends of, respectively, the first metal line 102-2 and the second metal line 104-1. In various embodiments, each of the misalignments 114-1 and 114-2 may be between about 0.2 and 5 nanometers, including all values and ranges therein, e.g., between about 0.2 and 3 nanometers, or between about 0.5 and 3 nanometers. In some embodiments, one of the misalignments 114-1 and 114-2 may be absent. For example, the first end of the metal stitch 106 and the first metal line 102-2 may be aligned along the direction of the x-axis in some embodiments, as is shown in the illustration of FIG. 1B, i.e., the misalignment 114-1 may be substantially 0 nanometers. In other embodiments of the interconnect arrangement 100A, the misalignment 114-2 may be substantially 0 nanometers, while the misalignment 114-1 may be as shown in FIG. 1A.

FIG. 1B illustrates an interconnect arrangement 100B, similar to the interconnect arrangement 100A of FIG. 1A, but where a misalignment 116 may be present between the first end of the metal stitch 106 and a sidewall of the first metal line 102-2, which may be measured along the y-axis of the example coordinate system shown. In particular, the misalignment 116 may be such that the first end of the metal stitch 106 may extend beyond the sidewall of the first metal line 102-2 that is closest to the first end of the metal stitch 106.

Although not specifically shown in FIG. 1B, in some embodiments, there may be a similar misalignment 116 between the second end of the metal stitch 106 and a sidewall of the second metal line 104-1, also measured along the y-axis of the example coordinate system shown, in that the second end of the metal stitch 106 may extend beyond the sidewall of the second metal line 104-1 that is closest to the second end of the metal stitch 106.

Thus, the misalignment(s) 116 may be between respective ends of the stitch 106 and the sidewalls of the first metal line 102-2 and/or the second metal line 104-1. In various embodiments, the misalignment(s) 116 may be between any values and ranges indicated for the misalignment 114, e.g., between about 0.2 and 5 nanometers, including all values and ranges therein, e.g., between about 0.2 and 3 nanometers, or between about 0.5 and 3 nanometers. While FIG. 1B illustrates the misalignment 114-2, in some embodiments of the interconnect arrangement 100B, the misalignment 114-2 may be substantially 0 nanometers.

FIG. 1C illustrates an interconnect arrangement 100C, similar to a combination of the interconnect arrangement 100A of FIG. 1A and the interconnect arrangement 100B of FIG. 1B, in that both the misalignment 114-1 may be present between the first end of the metal stitch 106 and one end of the first metal line 102-2, and the misalignment 116 may be present between the first end of the metal stitch 106 and a sidewall of the first metal line 102-2. While FIG. 1C illustrates the misalignment 114-2, in some embodiments of the interconnect arrangement 100C, the misalignment 114-2 may be substantially 0 nanometers.

FIG. 1D illustrates an interconnect arrangement 100D, where the misalignment 114-1 as described above may be combined with a misalignment 118 between the first end of the metal stitch 106 and a sidewall of the first metal line 102-2, which may be measured along the y-axis of the example coordinate system shown. In particular, the misalignment 118 may be such that the first end of the metal stitch 106 may not reach the outer sidewall of the first metal line 102-2.

In various embodiments, the misalignment 118 may be between any values and ranges indicated for the misalignment 114, e.g., between about 0.2 and 5 nanometers, including all values and ranges therein, e.g., between about 0.2 and 3 nanometers, or between about 0.5 and 3 nanometers. While FIG. 1D illustrates the misalignment 114-2, in some embodiments of the interconnect arrangement 100D, the misalignment 114-2 may be substantially 0 nanometers.

FIGS. 1A-1D illustrate embodiments where the stitch 106 is substantially perpendicular to the metal lines 102, 104, and where the stitch 106 provides electrical connectivity between metal lines of two closest adjacent tracks. In various further embodiments, any of the misalignments as described with reference to FIGS. 1A-1D may be present in interconnect arrangements where stitching was performed in different orientations and across different number of tracks than what was shown in FIGS. 1A-1D. To that end, FIGS. 2A-2E illustrate top-down views of example interconnect arrangements of IC structures where stitching was performed in different orientations and across different number of tracks, in accordance with some embodiments.

FIG. 2A illustrates an interconnect arrangement 200A, similar to the interconnect arrangement 100A of FIG. 1A, illustrating an embodiment where the stitch 106 is substantially perpendicular to the metal lines 102 and the metal lines 104.

FIG. 2B illustrates an interconnect arrangement 200B that differs from the interconnect arrangement 200A of FIG. 2A in that it illustrates an embodiment where the stitch 106 may be at an angle other than 90 degrees (i.e., not perpendicular) to the metal lines 102 and the metal lines 104.

FIGS. 2C-2E illustrate embodiments of interconnect arrangements with more than two tracks. Each of FIGS. 2C-2E illustrates an interconnect arrangement where one or more first metal lines of the first track (track 1) are labeled as 102-1n (where n denotes an instance of the first metal line in that track, e.g., 102-11 may be used to refer to the first metal line 102 of track 1, 102-12 may be used to refer to the second metal line 102 of track 1, etc.), one or more first metal lines of the third track (track 3) are labeled as 102-3n (e.g., 102-31 may be used to refer to the first metal line 102 of track 3, 102-32 may be used to refer to the second metal line 102 of track 3, etc.), and where similar notation is used for the second metal lines. FIGS. 2C-2E also illustrate that, in some embodiments, tracks of first and second metal lines 102, 104 may alternate. Since, according to a 2-color process for forming two sets of openings for two sets of metal lines of the stitching process described herein, sets of the first and second metal lines are formed by different lithographic exposures, such embodiments may be particularly advantageous to enable dense interconnect arrangements, especially when the second metal lines 104 are formed using a fabrication process that self-aligns them to the first metal lines 102.

FIG. 2C illustrates an interconnect arrangement 200C, showing an embodiment where the stitch 106 may couple metal lines of metal tracks that are not adjacent to one another. For example, FIG. 2C illustrates that the stitch 106 may couple the first metal line 102-12 of track 1 and the first metal line 102-31 of track 3, e.g., using the space between the two second metal lines 104-21 and 104-22 of track 2. Although not specifically shown or labeled in FIG. 2C, any of the misalignment possibilities described with reference to FIGS. 1A-1D for the misalignment between the first metal line 102-2 and the second metal line 104-1 are applicable to the misalignment between the first metal line 102-12 and the first metal line 102-31 as well as to the misalignment when the stitch 106 is used to couple any other pair of metal lines from tracks which are not adjacent to one another (e.g., to couple the first metal line 102-12 and a second metal line 104-61 of track 6, not specifically shown in FIG. 2C). Furthermore, while FIG. 2C illustrates that the stitch 106 is substantially perpendicular to the metal lines 102 and the metal lines 104, in other embodiments of the IC structure 200C, the stitch 106 may be at an angle other than 90 degrees (i.e., not perpendicular) to the metal lines 102 and the metal lines 104, e.g., as illustrated in FIG. 2B.

FIG. 2D illustrates an interconnect arrangement 200D and FIG. 2E illustrates an interconnect arrangement 200E, showing embodiments where the stitch 106 may couple metal lines to form C-shaped interconnects. For example, as shown in FIG. 2D, the stitch 106 may couple the first metal line 102-11 and the first metal line 102-31 (i.e., metal lines of different tracks of a set of metal lines formed by a single lithographic exposure process) to form a C-shape. In another example, as shown in FIG. 2E, the stitch 106 may couple the first metal line 102-11 and the second metal line 104-41 (i.e., metal lines of different tracks of two sets of metal lines formed by different lithographic exposures) to form a C-shape. Although not specifically shown or labeled in FIGS. 2D-2E, any of the misalignment possibilities described with reference to FIGS. 1A-1D for the misalignment between the first metal line 102-2 and the second metal line 104-1 are applicable to the misalignment between the metal lines coupled by the stitch 106 in the embodiments of FIGS. 2D-2E, as well as to misalignments between any other pair of metal lines coupled by the stitch 106 to form a C-shape. Furthermore, while FIGS. 2D-2E illustrate that the stitch 106 is substantially perpendicular to the metal lines 102 and the metal lines 104, in other embodiments of the IC structures 200D and 200E, the stitch 106 may be at an angle other than 90 degrees (i.e., not perpendicular) to the metal lines 102 and the metal lines 104, e.g., as illustrated in FIG. 2B.

FIGS. 1A-1D and FIGS. 2A-2E illustrate embodiments where the stitch 106 is used to form a jog between metal lines of different track of Mx. In other embodiments, stitching may be used to perform metal upsizing. To that end, FIGS. 3A-3C illustrate top-down views of example interconnect arrangements of IC structures where stitching was performed to increase widths of at least portions of the tracks, in accordance with some embodiments.

Similar to FIGS. 1A-1D and FIGS. 2A-2E, each of FIGS. 3A-3C illustrates an interconnect arrangement where the first metal line 102-11 belongs to track 1 and the second metal lines 104-21 and 104-22 belong to track 2, where the pitch between two closest adjacent tracks may be the pitch 112, as shown in FIG. 1. Also similar to FIGS. 1A-1D and FIGS. 2A-2E, each of FIGS. 3A-3C further illustrates the stitch 106 that provides electrical coupling between the first metal line 102-11 and the second metal line 104-21. However, there are also important differences between the embodiments shown in FIGS. 1A-1D and FIGS. 2A-2E and those shown in FIGS. 3A-3C. A length of the stitch 106 may be considered to be the dimension that is greater than the dimension in a direction perpendicular to it, which may then be considered a width of the stitch 106. For example, in FIGS. 1A-1D and FIGS. 2A and 2C-2E, the length of the stitch 106 may be the dimension measured along the direction of the y-axis of the example coordinate system shown, while the width of the stitch 106 may be the dimension measured along the direction of the x-axis. In FIG. 2B, the length of the stitch 106 may be the dimension measured along the direction of the dashed line shown in FIG. 2B, while the width of the stitch 106 may be the dimension measured along the direction perpendicular to the dashed line. In contrast, FIGS. 3A-3C illustrate embodiments where the length of the stitch 106 may be the dimension measured along the direction of the x-axis of the example coordinate system shown (i.e., along the direction of the long axis of the metal lines 102, 104), while the width of the stitch 106 may be the dimension measured along the direction of the y-axis. Such embodiments may be particularly advantageous where the stitch 106 is used to increase a width of any single metal line 102 or metal line 104 by extending (in its' width) across metal lines of different tracks. For example, FIG. 3A illustrates an interconnect arrangement 300A and FIG. 3B illustrates an interconnect arrangement 300B, showing embodiments where the stitch 106 may couple metal lines 102-11 and 104-21 along the length L of the stitch 106, thereby providing a single metal line portion 310 that has a width W that is larger than the width of each individual metal line. FIG. 3C further illustrates an interconnect arrangement 300C, showing an embodiment where the stitch 106 may extend in its' width W across more than just two metal tracks.

FIG. 3A illustrates an embodiment where the end of the second metal line 104-21 may have a misalignment 314 by extending beyond the end of the stitch 106, while FIG. 3B illustrates an embodiment where the end of the second metal line 104-21 may have a misalignment 316 by not reaching the end of the stitch 106. In various embodiments, any of the misalignments 314, 316 may be between any values and ranges indicated for the misalignment 114, e.g., between about 0.2 and 5 nanometers, including all values and ranges therein, e.g., between about 0.2 and 3 nanometers, or between about 0.5 and 3 nanometers. In other embodiments, any of the misalignments 314, 316 may be substantially 0 nanometers.

In general for the embodiments shown in FIGS. 3A-3C, any of the misalignment possibilities described with reference to FIGS. 1A-1D for the misalignment between the first metal line 102-2 and the second metal line 104-1 are applicable to the misalignment between the first metal line 102-11 and the second metal line 104-21 as well as to the misalignment when the stitch 106 is used to perform upsizing across more than two metal tracks. Furthermore, while FIGS. 3A-3C illustrates that the stitch 106 is substantially perpendicular to the metal lines 102 and the metal lines 104, in other embodiments of the IC structure 200C, the stitch 106 may be at an angle other than 90 degrees (i.e., not perpendicular) to the metal lines 102 and the metal lines 104, e.g., as illustrated in FIG. 2B.

Example Method of Fabricating an Interconnect Arrangement Using Stitching

Figure 4B:
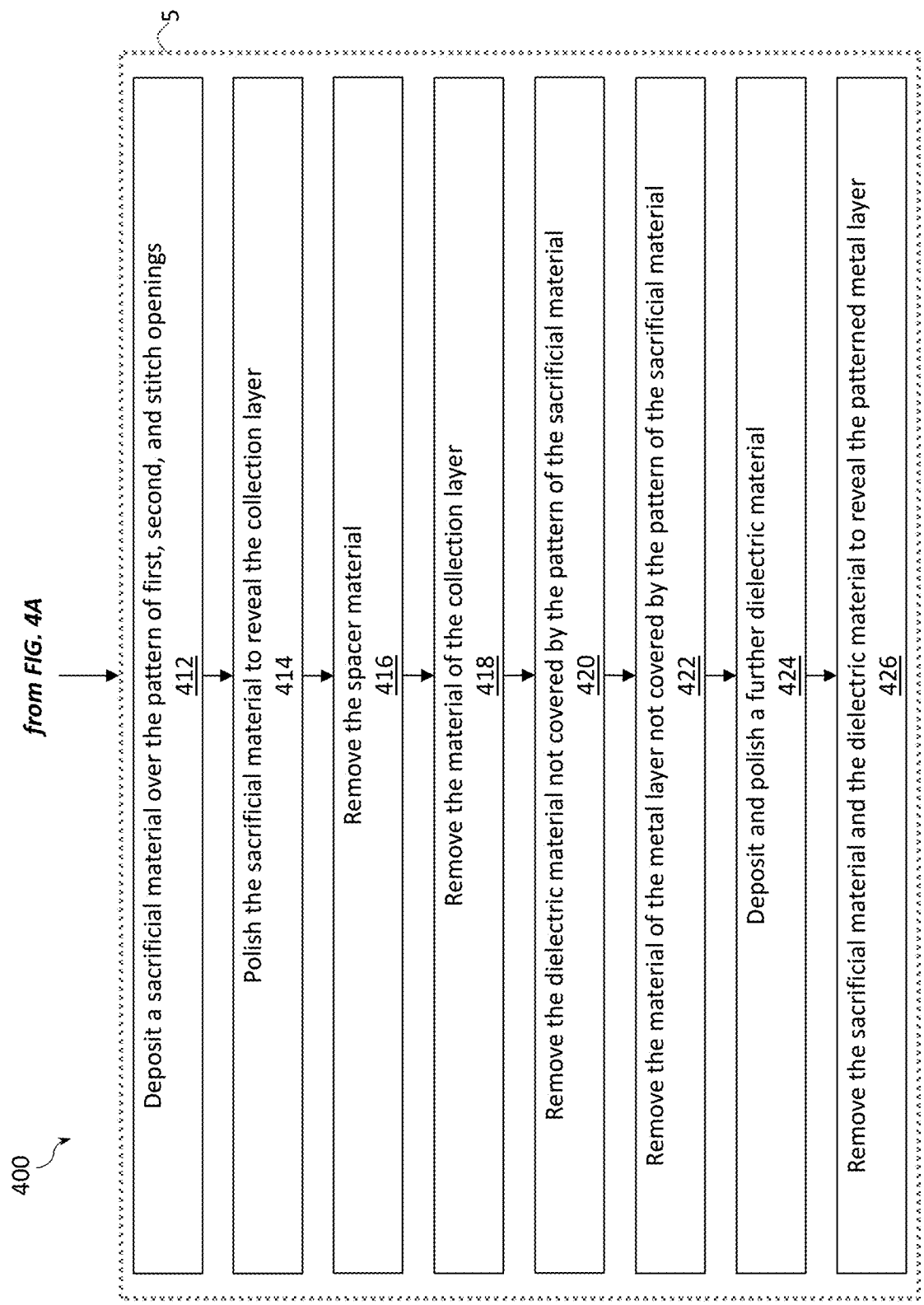

FIGS. 4A-4B provide a flow diagram of an example method 400 of using stitching, in accordance with some embodiments.

Although the operations of the method 400 are illustrated once each and in a particular order, the operations may be performed in any suitable order and repeated as desired. For example, one or more operations may be performed in parallel to manufacture, substantially simultaneously, multiple interconnect arrangements with stitching as described herein. In another example, the operations may be performed in a different order to reflect the structure of a particular device assembly in which one or more interconnect arrangements with stitching as described herein will be included.

In addition, the example manufacturing method 400 may include other operations not specifically shown in FIG. 4, such as various cleaning or planarization operations as known in the art. For example, in some embodiments, a support structure, as well as layers of various other materials subsequently deposited thereon, may be cleaned prior to, after, or during any of the processes of the method 400 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the method 400 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 400 may be illustrated with reference to the example embodiments shown in FIGS. 5A-5M, illustrating top-down and cross-sectional side views for various stages in the manufacture of an example IC structure using stitching, in accordance with some embodiments. In particular, the top illustration of each of FIGS. 5A-5M shows a cross-sectional side view (in particular, the view of an x-z plane of a reference coordinate system x-y-z shown at the bottom left corner of each of FIGS. 5A-5M), while the bottom illustration shows a top-down view of the IC structure (i.e., the view of an x-y plane of the reference coordinate system shown). In different ones of FIGS. 5A-5M, planes along which the cross-sections of the top illustrations are taken are indicated with a horizontal dashed line AA across the top-down views of these figures.

A number of elements referred to in the description of FIGS. 5A-5M with reference numerals are illustrated in these figures with different patterns, with a legend showing the correspondence between the reference numerals and patterns being provided at the bottom of each drawing page containing FIGS. 5A-5M. For example, the legend illustrates that FIGS. 5A-5M use different patterns to show a support structure 530, a metal layer 532, a collection layer 534, etc. Furthermore, although a certain number of a given element may be illustrated in some of FIGS. 5A-5M (e.g., a certain number of first openings, a certain number of second openings, and one stitch opening), this is simply for ease of illustration, and more, or less, than that number may be included in an Mx interconnect arrangement of an IC structure fabricated according to the method 400. Still further, various views shown in FIGS. 5A-5M are intended to show relative arrangements of various elements therein. In other embodiments, various IC structures where stitching was used, or portions thereof, may include other elements or components that are not illustrated (e.g., transistor portions, various components that may be in electrical contact with any of the metal lines, etc.).

In general, the method 400 may include 5 processes, labeled in FIGS. 4A-4B as processes 1, 2, 3, 4, and 5. FIGS. 4A-4B illustrate some specific implementation details for carrying out some of the processes (e.g., the process 2 of the method 400 is shown in FIG. 4A to include a process 404 and a process 406, while the process 5 of the method 400 is shown in FIG. 4B to include processes 414 through 424). On the other hand, some other ones of the processes 1-5 are not shown to include multiple processes like the processes 2 and 5, even though they might also include multiple processes in some embodiments. Thus, besides what is illustrated in FIGS. 4A-4B and FIGS. 5A-5M, other ways of performing the processes 1-5 of the method 400 are possible and are within the scope of the present disclosure.

Figure 5A:
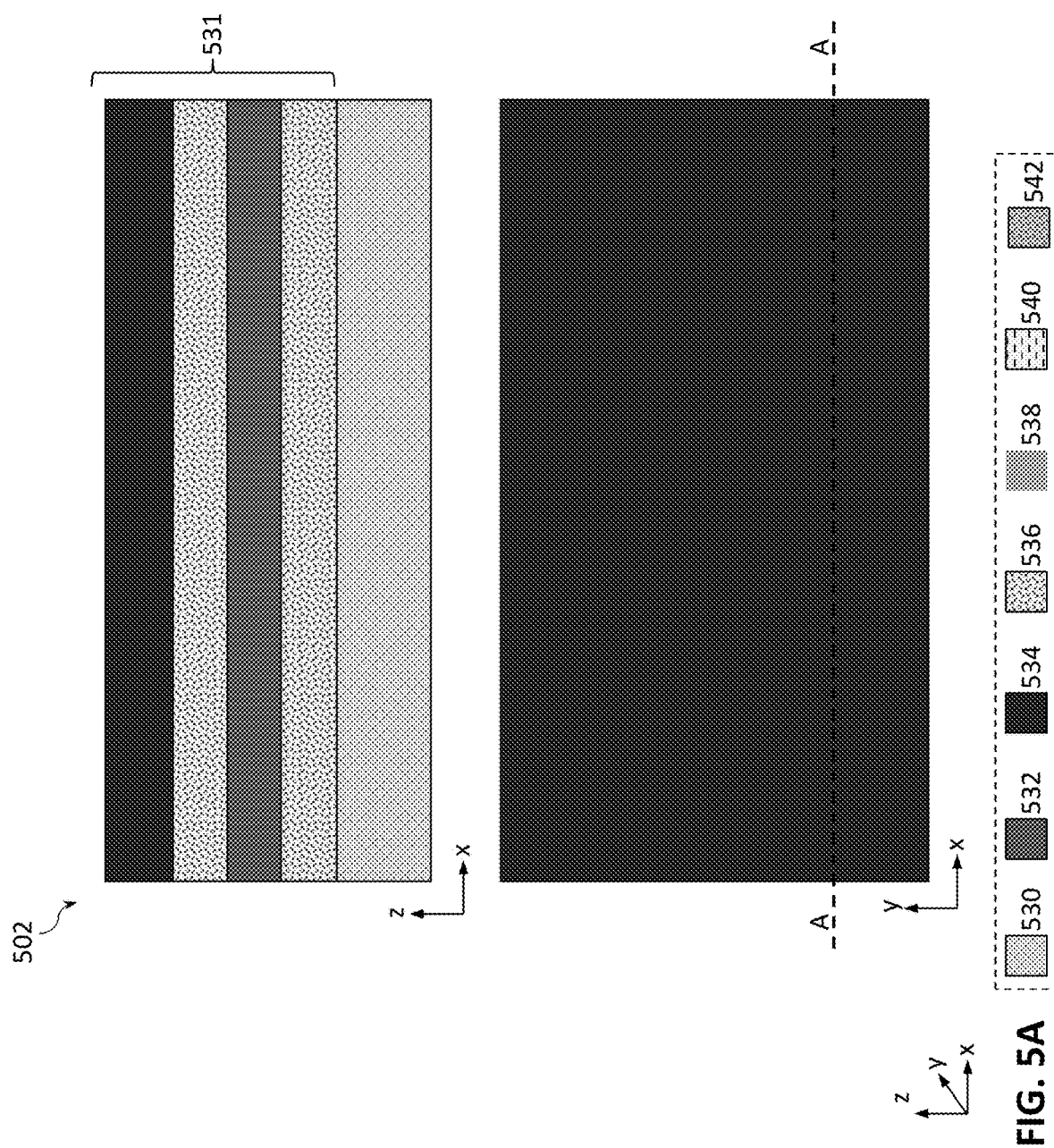

Turning to FIG. 4A, the method 400 may begin with a process 1 that may include a process 402 in which a stack with a metal layer and a collection layer to pattern is provided over a support structure. An IC structure 502, depicted in FIG. 5A, illustrates an example result of the process 402. As shown in FIG. 5A, the IC structure 502 may include a support structure 530, and a stack 531 provided over the support structure 530. The stack 531 may include at least a metal layer 532 and a collection layer 534. However, in some embodiments, the stack 531 may also, optionally, include a dielectric material 536 between the support structure 530 and the metal layer 532 and/or between the metal layer 532 and the collection layer 534 (both layers of the dielectric material 536 are shown in FIG. 5A, but one or more of these layers may be absent in some embodiments of the method 400).

In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which an IC may be built falls within the spirit and scope of the present disclosure. In various embodiments, the support structure 530 may include any such substrate, possibly with some layers and/or front end of line (FEOL) devices (e.g., various transistors) already formed thereon, not specifically shown in the present figures, providing a suitable surface for forming a metallization stack with one or more interconnect arrangements where stitching was used as described herein.

The metal layer 532 may include a layer of any electrically conductive material suitable for forming the first metal lines 102, the second metal lines 104, and the one or more stitches 106 from. In some embodiments, the metal layer 532 may include one or more of any suitable electrically conductive materials (conductors). Such materials may include any suitable electrically conductive material, alloy, or a stack of multiple electrically conductive materials. In some embodiments, various electrically conductive materials described herein may include one or more metals or metal alloys, with metals such as copper, ruthenium, palladium, platinum, cobalt, nickel, molybdenum, hafnium, zirconium, titanium, tantalum, and aluminum. In some embodiments, various electrically conductive materials described herein may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g. hafnium nitride, zirconium nitride, titanium nitride, tantalum nitride, and aluminum nitride) of one or more metals. The electrically conductive material of the metal layer 532 may be deposited in the process 402 using a deposition technique such as, but not limited to, atomic layer deposition (ALD), chemical vapor deposition (CVD), physical vapor deposition (PVD) (e.g., evaporative deposition, magnetron sputtering, or e-beam deposition), plasma enhanced CVD (PECVD), or electroplating.

The collection layer 534 may include a layer of any suitable material in which patterns of openings for the first metal lines 102, the second metal lines 104, and the one or more stitches 106 will be collected (hence, the name "collection" layer) before being transferred to the metal layer 532. In some embodiments, the collection layer 534 may include a dielectric material, such as any suitable interlayer dielectric (ILD) material. In some embodiments, the dielectric material of the collection layer 534 may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the dielectric material of the collection layer 534 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass. Other examples of low-k dielectric materials include organic polymers such as polyimide, polynorbornenes, benzocyclobutene, perfluorocyclobutane, or polytetrafluoroethylene (PTFE). Still other examples of low-k dielectric materials include silicon-based polymeric dielectrics such as hydrogen silsesquioxane (HSQ) and methylsilsesquioxane (MSQ). Some examples of low-k materials include various porous dielectric materials, such as for example porous silicon dioxide or porous carbon-doped silicon dioxide, where relatively large voids or pores are created in a dielectric layer in order to reduce the overall dielectric constant of the layer, since voids can have a dielectric constant of nearly 1. The material of the collection layer 534 may be deposited using any suitable process such as spin-coating, dip-coating, ALD, CVD, PVD, etc.

The dielectric material 536 may include any of the dielectric materials described with reference to the material of the collection layer 534 and may be deposited using any of the techniques described for the collection layer 534. When the dielectric material 536 is present, in some embodiments, the dielectric material 536 may be a material that is etch-selective with respect to some other materials used in the method 400, e.g., the dielectric material 536 may be etch-selective with respect to the material of the collection layer 534. As known in the art, two materials are said to have "sufficient etch selectivity" when etchants used to etch one material do not substantially etch the other, enabling selective etching of one material but not the other.

The method 400 may then continue with a process 2 that includes performing a first lithographic process to provide openings, in the collection layer provided in the process 1, for a first set of metal lines. In some embodiments, the process 2 may include a process 404 and a process 406, which may be particularly advantageous if it is desirable to ensure that openings in the collection layer for a second set of metal lines are self-aligned to the openings for the first set of metal lines.

Figure 5B:
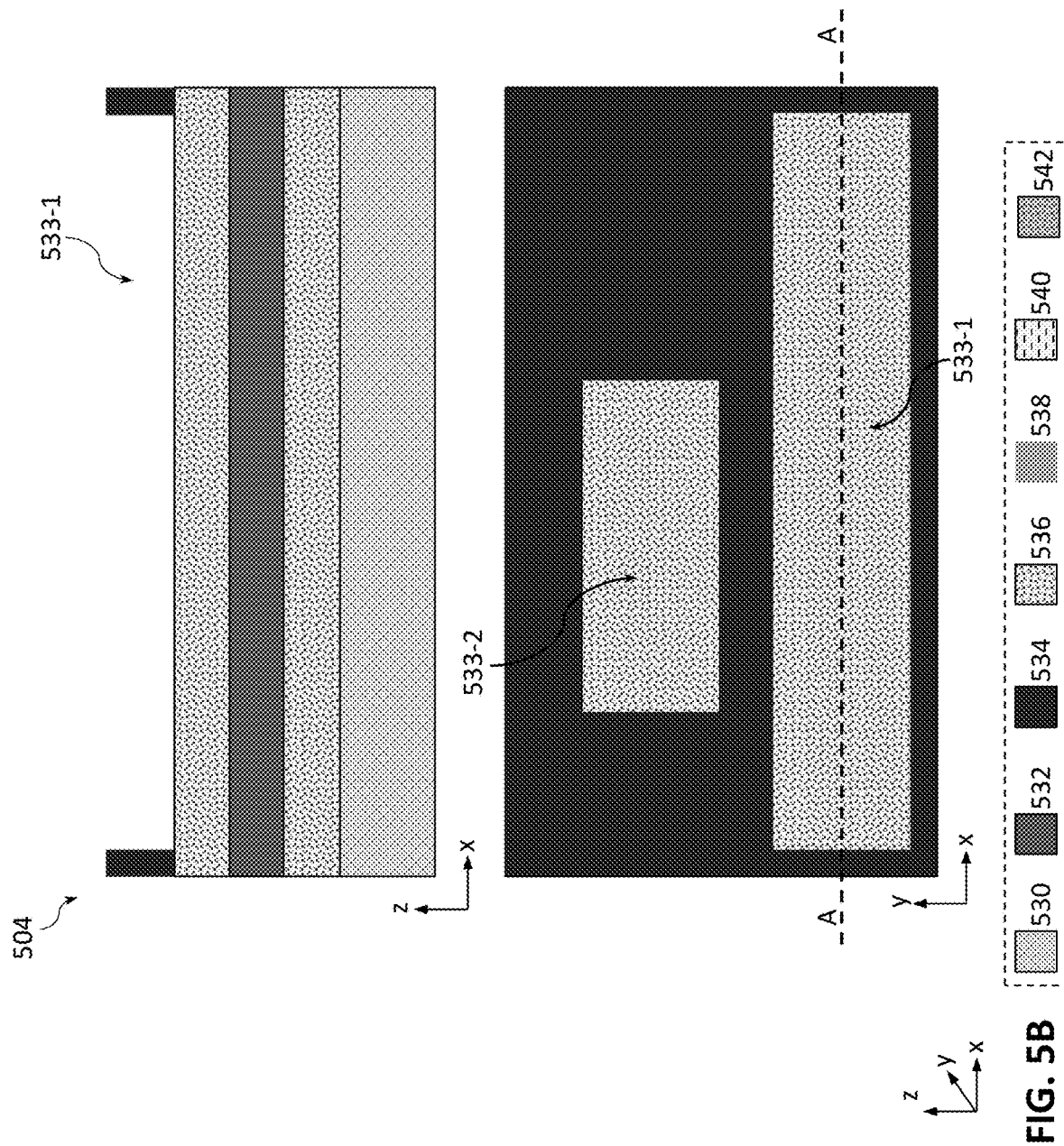

As shown in FIG. 4A, the process 404 may include performing a first lithographic process to provide enlarged openings, in the collection layer provided in the process 1, for a first set of metal lines. An IC structure 504, depicted in FIG. 5B, illustrates an example result of the process 404. The IC structurer 504 illustrates two openings 533, shown as an opening 533-1 and an opening 533-2, each having a long axis in a direction of the x-axis of the example coordinate system shown. The dimensions of the openings 533 may be such that when a spacer material 538 is deposited on the sidewalls of the openings 533 in the process 406, thus forming spacer-lined openings 535, the dimensions of the spacer-lined openings 535 correspond to (e.g., are substantially the same as those of) the dimensions desired for the first set of metal lines.

In various embodiments, any suitable patterning techniques may be used in the process 404 to form the openings 533 in the desired locations and of the desired geometry, in conjunction with a suitable etching technique to remove a portion of the material of the collection layer 534 to form the openings 533. Although not specifically shown in FIG. 5B, performing the first lithographic process may involve providing a layer above the collection layer 534 (e.g., providing a layer of a photoresist material in case the process 404 includes photolithographic patterning), patterning the layer above the collection layer 534 with the desired pattern (in this case, the enlarged openings 533) and then transferring the pattern to the collection layer 534. This also applies to performing the second and third lithographic processes of the method 400. The patterning techniques that may be used in the process 404 include, but are not limited to, photolithographic or electron-beam (e-beam) patterning. The etching techniques that may be used in the process 404 include, but are not limited to, a dry etch, such as e.g., radio frequency (RF) reactive ion etch (RIE) or inductively coupled plasma (ICP) RIE. In some embodiments, the etch performed in the process 404 to remove portions of the material of the collection layer 534 to form the openings 533 may include an anisotropic etch, using etchants in a form of e.g., chemically active ionized gas (i.e., plasma) using e.g., bromine (Br) and chloride (Cl) based chemistries. In some embodiments, during the etch of the process 404, the IC structure may be heated to elevated temperatures, e.g., to temperatures between about room temperature and 200 degrees Celsius, including all values and ranges therein, to promote that byproducts of the etch are made sufficiently volatile to be removed from the surface.

Figure 5C:
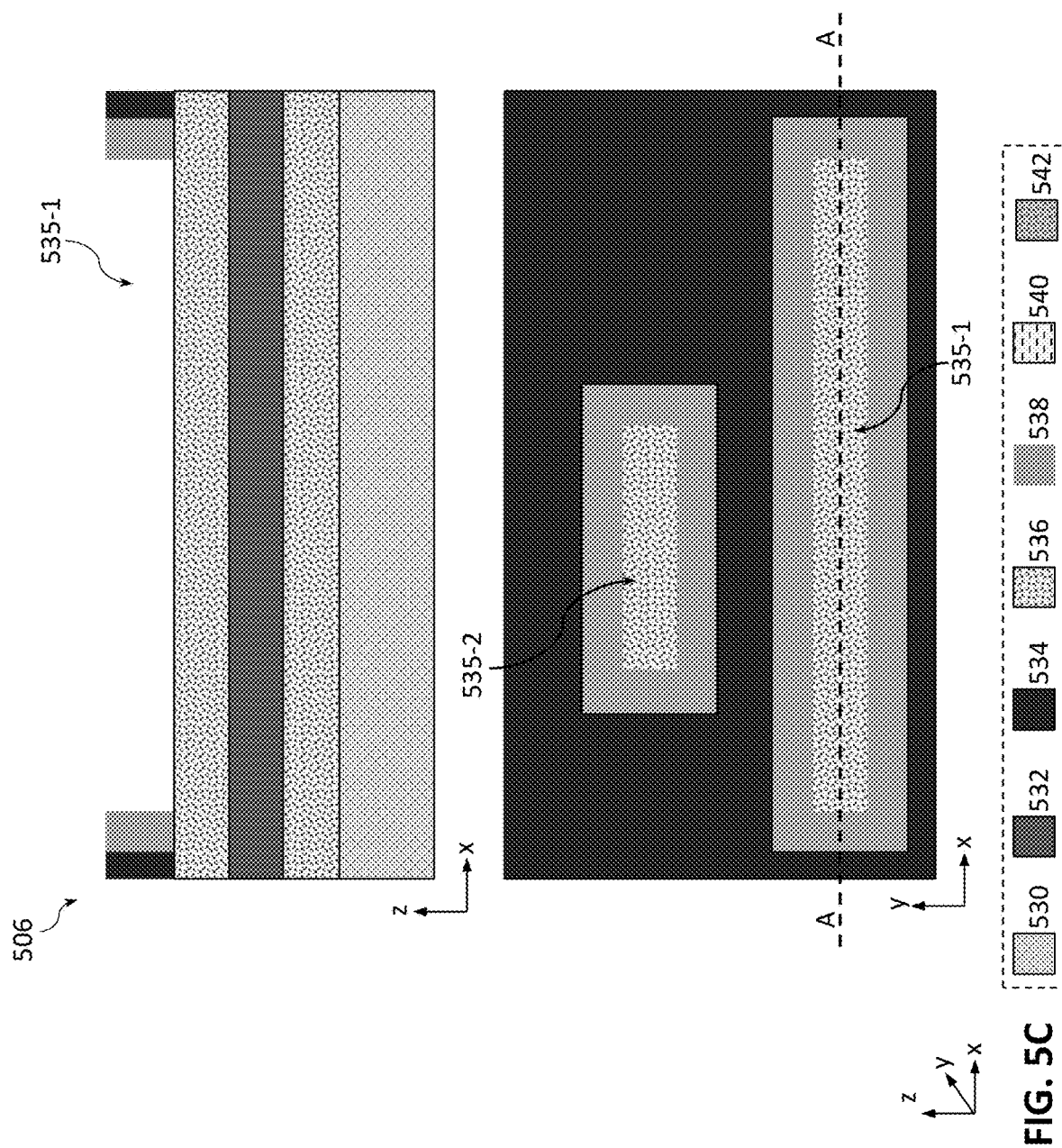

As shown in FIG. 4A, the process 406 may include depositing a spacer material over the sidewalls of the enlarged openings formed in the process 404, to provide openings for the first set of meta lines. An IC structure 506, depicted in FIG. 5C, illustrates an example result of the process 406. The IC structurer 506 illustrates that the sidewalls of the openings 533 provided in the process 404 have been lined with a spacer material 536, thus forming spacer-lined openings 535. The dimensions of the spacer-lined openings 535 may correspond to (e.g., are substantially the same as those of) the dimensions desired for the first set of metal lines. The spacer material 536 may include any of the dielectric materials described above. When the openings formed for the second set of metal lines are to be self-aligned to the openings formed in the process 2, the spacer material 536 is to be etch-selective with respect to the material(s) used to form a mask above the IC structure 506 for patterning the openings for the second set of metal lines. Providing the spacer material 536 over the sidewalls of the openings 533 in the process 406 may include depositing the spacer material 536 using any suitable conformal deposition technique, such as ALD or CVD, possibly in combination with an etch to remove the spacer material 536 from the bottom of the openings 533 and/or in combination with using some additional material, such as a suitable self-assembled monolayer (SAM) material at the bottom of the openings 533 to prevent/reduce deposition of the spacer material 536 over the bottom of the openings 533 (such an additional material may layer be removed).

Figure 5D:
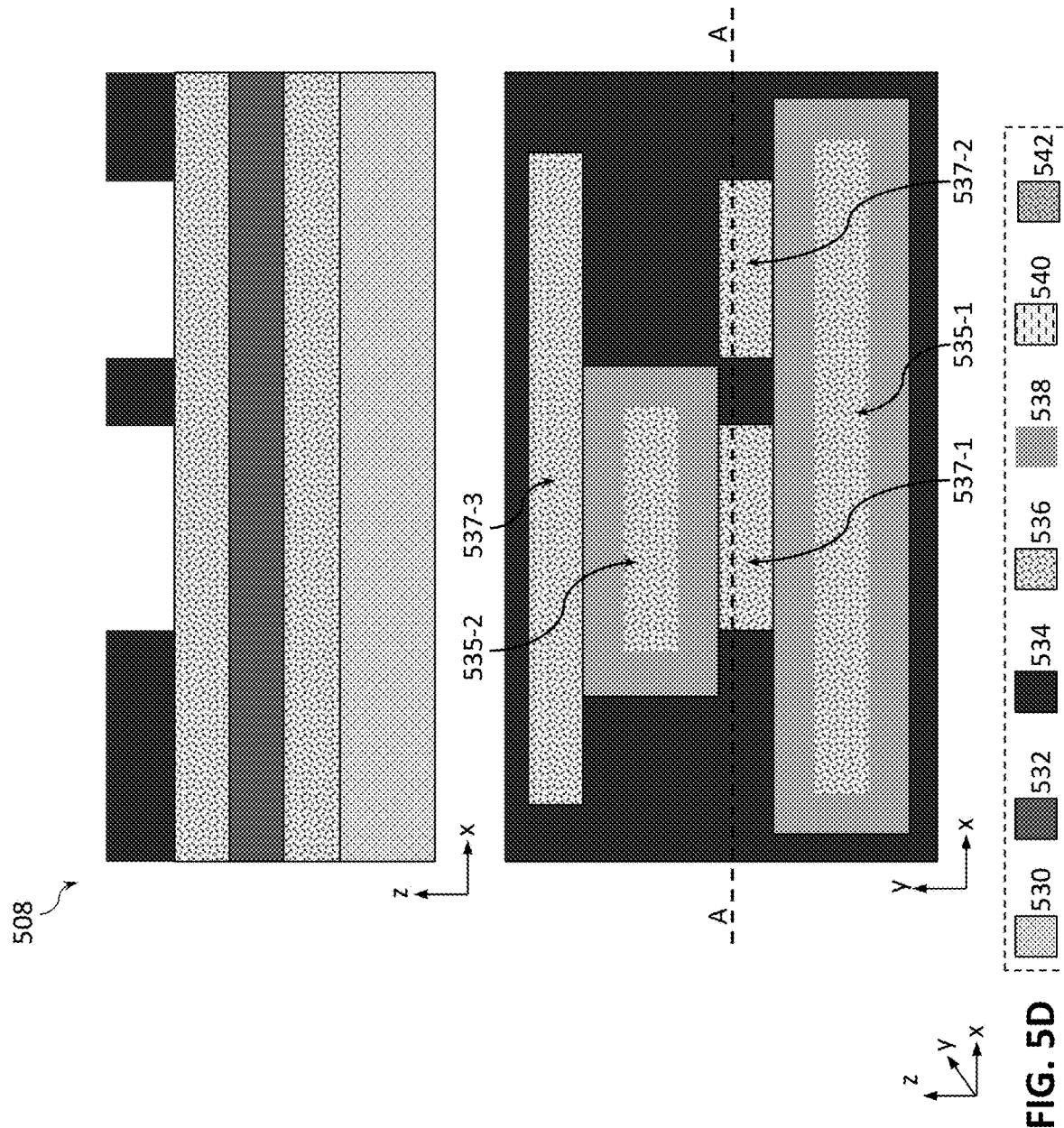

The method 400 may then continue with a process 3 that includes performing a second lithographic process to provide openings, in the collection layer provided in the process 1, for a second set of metal lines. In some embodiments, the process 3 may include a process 408. An IC structure 508, depicted in FIG. 5D, illustrates an example result of the process 408. The IC structure 508 illustrates openings 537, shown as an opening 537-1 and an opening 537-2 that have a common long axis in a direction of the x-axis of the example coordinate system shown (note that the cross-sectional side view of FIG. 5D and the subsequent drawings illustrates cross-sections along a different plane AA than that shown in FIGS. 5A-5C). FIG. 5D further illustrates an opening 537-3 along a different long axis in a direction of the x-axis. The dimensions of the openings 537 along the y-axis may be defined by the spacer material 538 provided over the sidewalls of the spacer-lined openings 535, thus realizing self-alignment of the openings 537 (with respect to the y-axis) to the spacer-lined openings 535. The patterning and etching techniques used in the process 408 may include any of the techniques described with reference to the process 404.

Although not specifically shown in FIG. 5D, performing the second lithographic process in the process 408 may involve providing a layer above the collection layer 534 (e.g., providing a layer of a photoresist material in case the process 408 includes photolithographic patterning), patterning the layer above the collection layer 534 with the desired pattern (in this case, openings suitable for forming the openings 537) and then transferring the pattern to the collection layer 534 to form the openings 537.

In some embodiments, patterning of the layer above the collection layer 534 in the process 408 may include forming enlarged openings for the future openings 537 and then depositing a second spacer material on the sidewalls of the enlarged openings to form a spacer-lined enlarged openings in the layer above the collection layer 534. The spacer-lined enlarged openings may overlap somewhat with the spacer material 538 in the openings 535 underneath, because such spacer-lined enlarged openings are not self-aligned to the spacer-lined openings 535. In such embodiments, the etch performed in the process 408 may be selective with respect to the spacer material 538 so that the material of the collection layer 534 is removed through the spacer-lined enlarged openings for the future openings 537 without substantially etching the spacer material 538, thus aligning the openings 537 to the edges of the spacer material 538 on the sidewalls of the openings 535.

In other embodiments, patterning of the layer above the collection layer 534 in the process 408 may not include forming enlarged openings as described above, but directly forming openings in the patterning layer that are substantially of the dimensions for the future openings 537. Such openings in the patterning layer may overlap somewhat with the spacer material 538 in the openings 535 underneath, because such openings are not self-aligned to the spacer-lined openings 535. In such embodiments, the etch performed in the process 408 may be selective with respect to the spacer material 538 so that the material of the collection layer 534 is removed through the openings for the future openings 537 without substantially etching the spacer material 538, thus aligning the openings 537 to the edges of the spacer material 538 on the sidewalls of the openings 535.

Figure 5E:
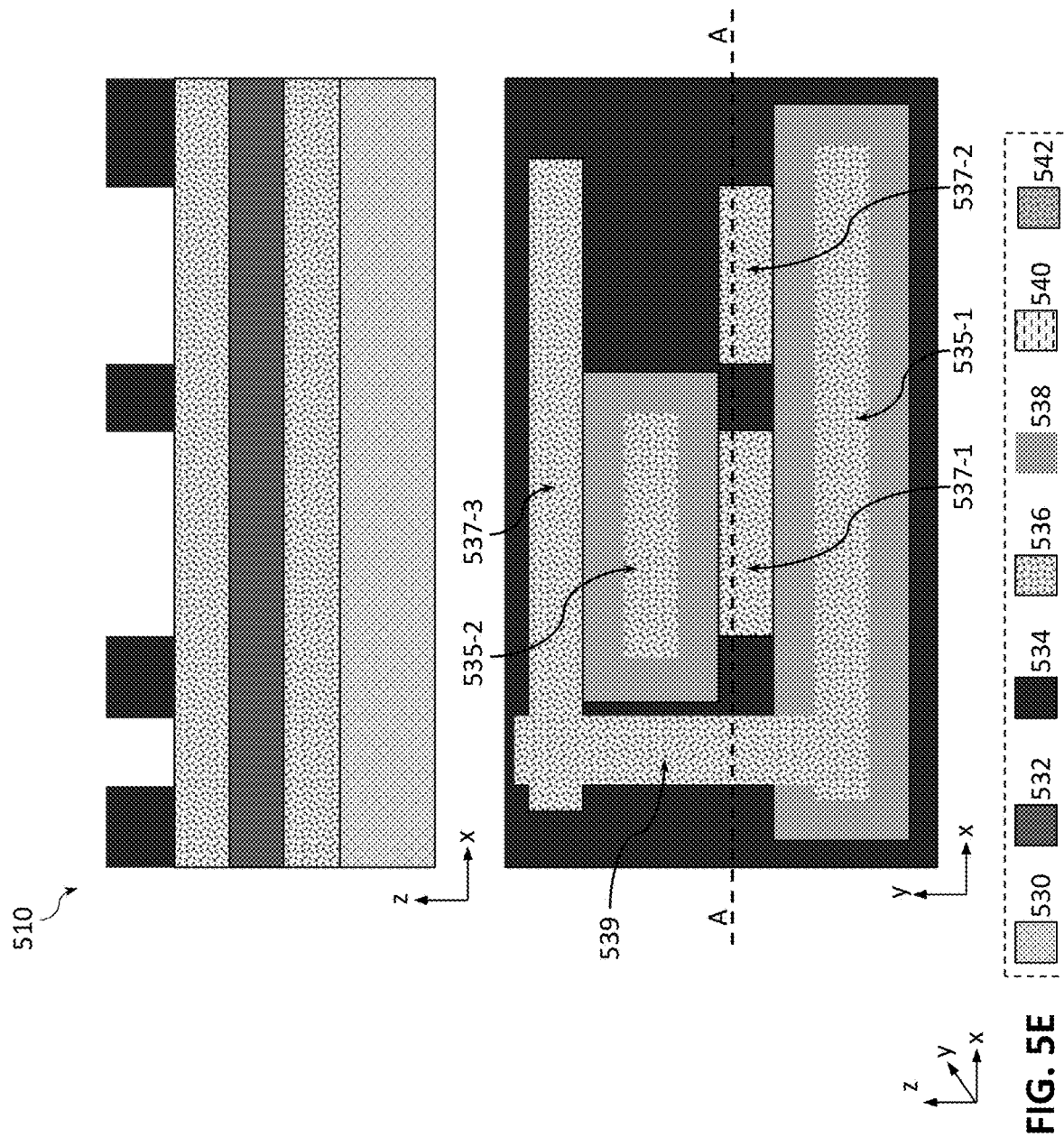

The method 400 may then continue with a process 4 that includes performing a third lithographic process to provide one or more openings, in the collection layer provided in the process 1, for one or more stitches. In some embodiments, the process 4 may include a process 410. An IC structure 510, depicted in FIG. 5E, illustrates an example result of the process 410.

The IC structurer 510 illustrates an opening 539 that has a long axis in a direction of the y-axis of the example coordinate system shown. The patterning and etching techniques used in the process 410 may include any of the techniques described with reference to the process 408, except that the etch performed in the process 410 may be an etch that can etch through the spacer material 538, thus removing both the material of the collection layer 534 and the spacer material 538 exposed by the patterning of the process 410.

The method 400 may then continue with a process 5 that includes transferring the pattern of the first openings 535, the second openings 537, and the stitch opening 539 to the metal layer 532. In some embodiments, the process 5 may include processes 412-426, as shown in FIG. 4B.

Figure 5F:
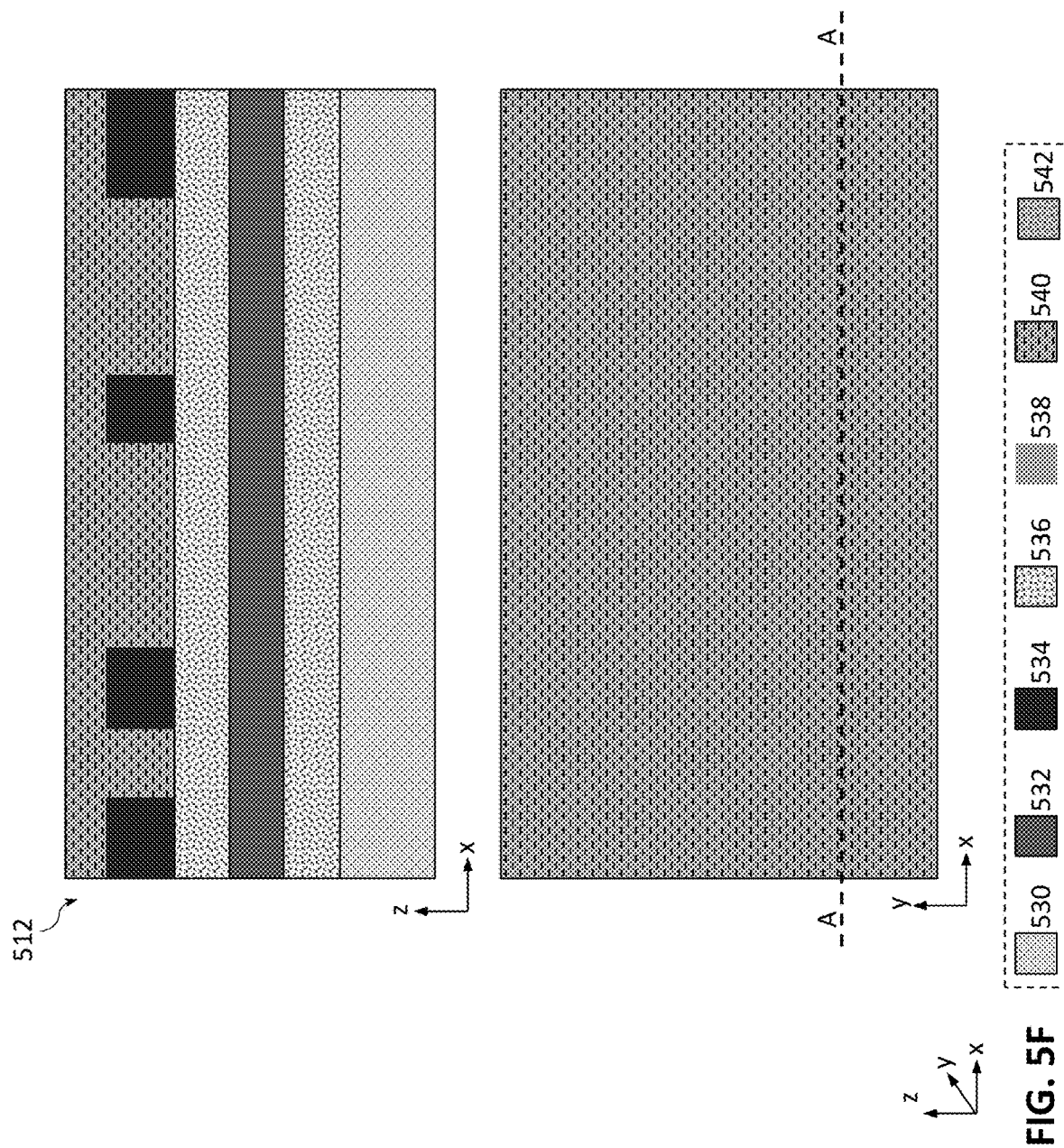

As shown in FIG. 4B, the process 412 may include depositing a sacrificial material over the IC structure 510. An IC structure 512, depicted in FIG. 5F, illustrates an example result of the process 412. The IC structure 512 illustrates a sacrificial material 540 over all of the elements of the IC structure 510. The sacrificial material 540 may, e.g., include any of the dielectric materials described above and may be deposited using the methods for depositing dielectric materials, described above. In some embodiments, the sacrificial material 540 may be a material that is etch-selective with respect to the spacer material 538.

Figure 5G:
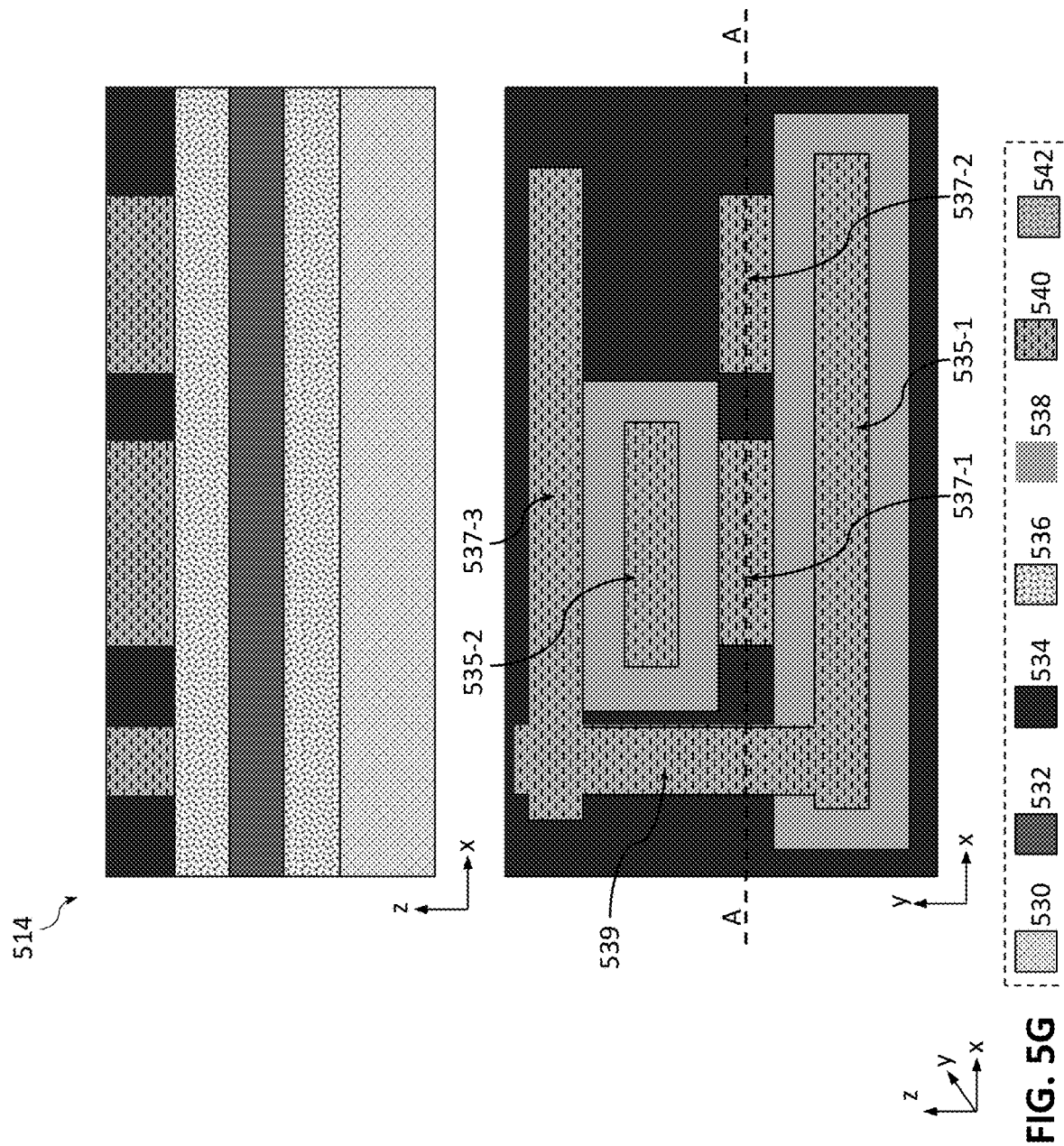

As further shown in FIG. 4B, the process 414 may include polishing the sacrificial material deposited in the process 412 to reveal the collection layer. An IC structure 514, depicted in FIG. 5G, illustrates an example result of the process 414. The IC structurer 514 illustrates the IC structure 510 where the openings 535, 537, and 539 have been filled with the sacrificial material 540. In some embodiments, the process 414 may include any suitable polishing process, such as CMP.

Figure 5H:
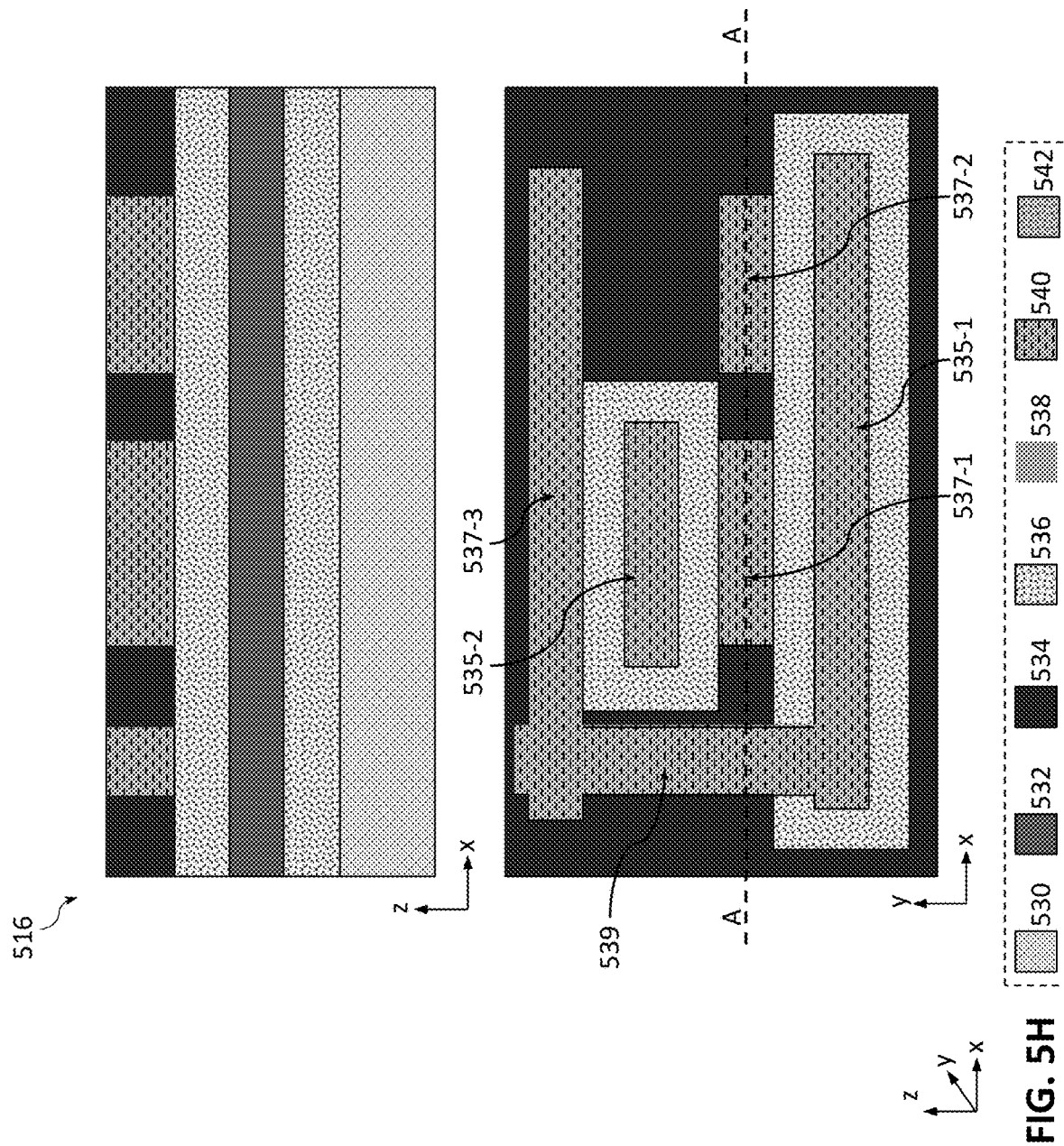

The process 416 may include removing the spacer material deposited in the process 406. An IC structure 516, depicted in FIG. 5H, illustrates an example result of the process 416. The IC structure 516 illustrates the IC structure 514 where the spacer material 538 has been removed. In some embodiments, the process 416 may include any suitable etching process that can remove the spacer material 538 without substantially etching other portions of the IC structure 514. To that end, the spacer material 538 may be a material that is etch-selective with respect to each of the sacrificial material 540, the material of the collection layer 534, and the dielectric material 536.

Figure 5I:
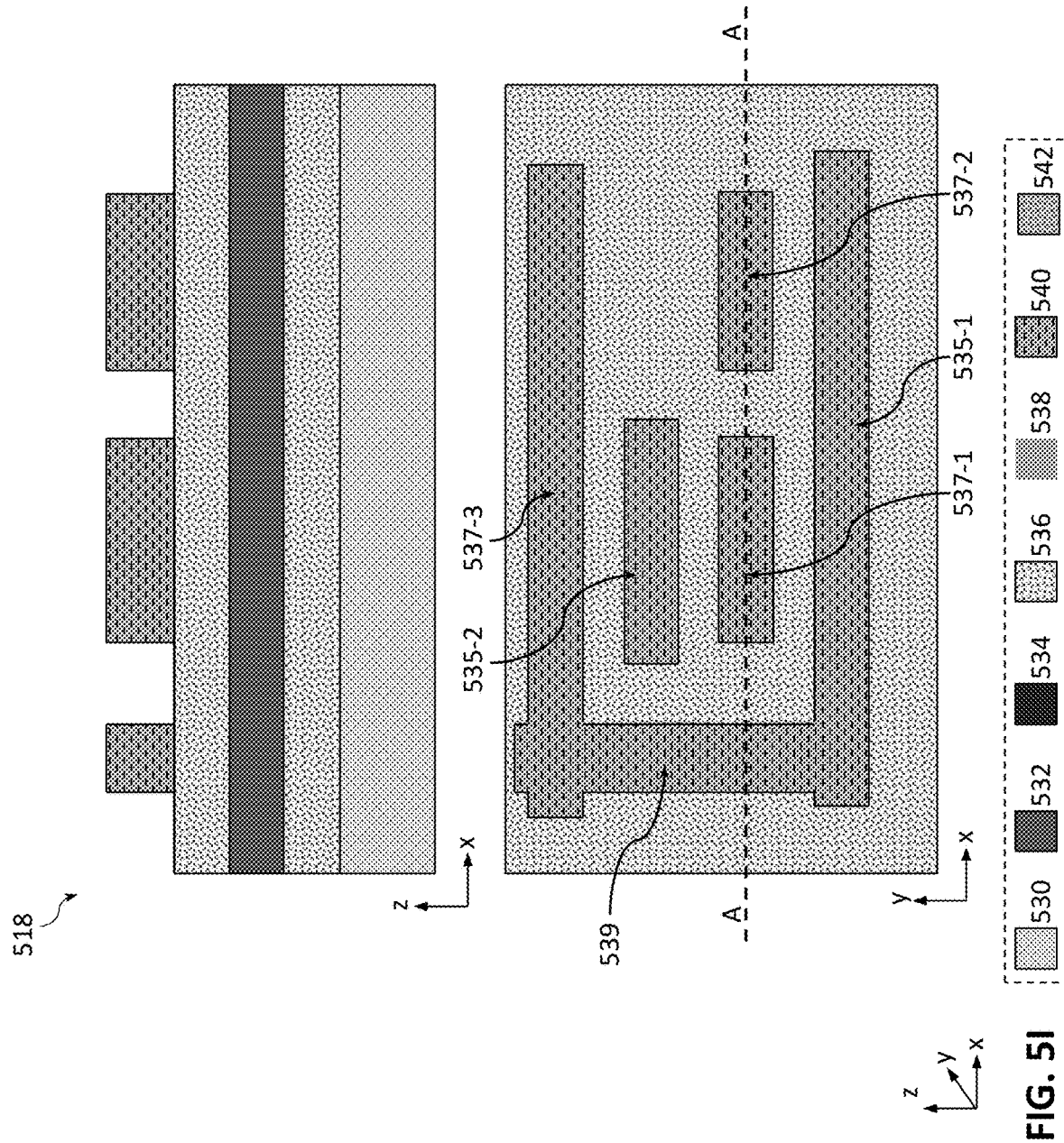

FIG. 4B further illustrates that the process 418 may include removing the material of the collection layer that was revealed in the process 414. An IC structure 518, depicted in FIG. 5I, illustrates an example result of the process 418. The IC structure 518 illustrates the IC structure 516 where the material of the collection layer 534 has been removed, e.g., using an ashing process. In some embodiments, the process 418 may include any suitable etching process that can remove the material of the collection layer 534 without substantially etching other portions of the IC structure 518. To that end, the material of the collection layer 534 may be a material that it etch-selective with respect to the dielectric material 536.

Figure 5J:
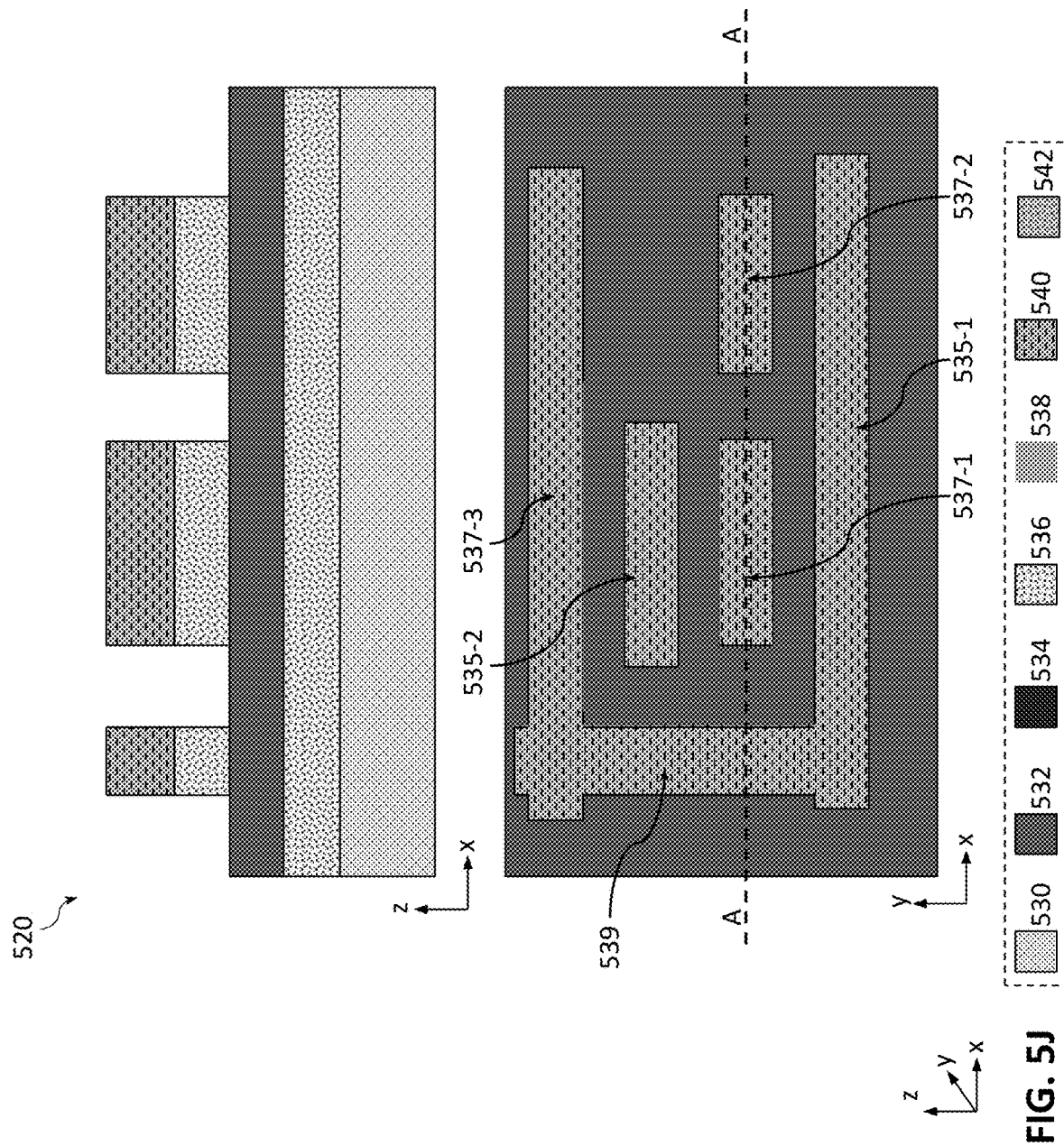

The process 420 may include removing the dielectric material that may be above the metal layer 532. An IC structure 520, depicted in FIG. 5J, illustrates an example result of the process 420. The IC structure 520 illustrates the IC structure 518 where the dielectric material 536 that is not covered by the sacrificial material 540 has been removed, e.g., using anisotropic etch such as RIE. Thus, the pattern of the sacrificial material 540 may act as a mask for removing the dielectric material 536 in the process 420. In some embodiments, the process 420 may include any suitable etching process that can remove the dielectric material 536 without substantially etching other portions of the IC structure 520. To that end, the dielectric material 536 may be a material that is etch-selective with respect to the sacrificial material 540 and to the material of the metal layer 532.

Figure 5K:
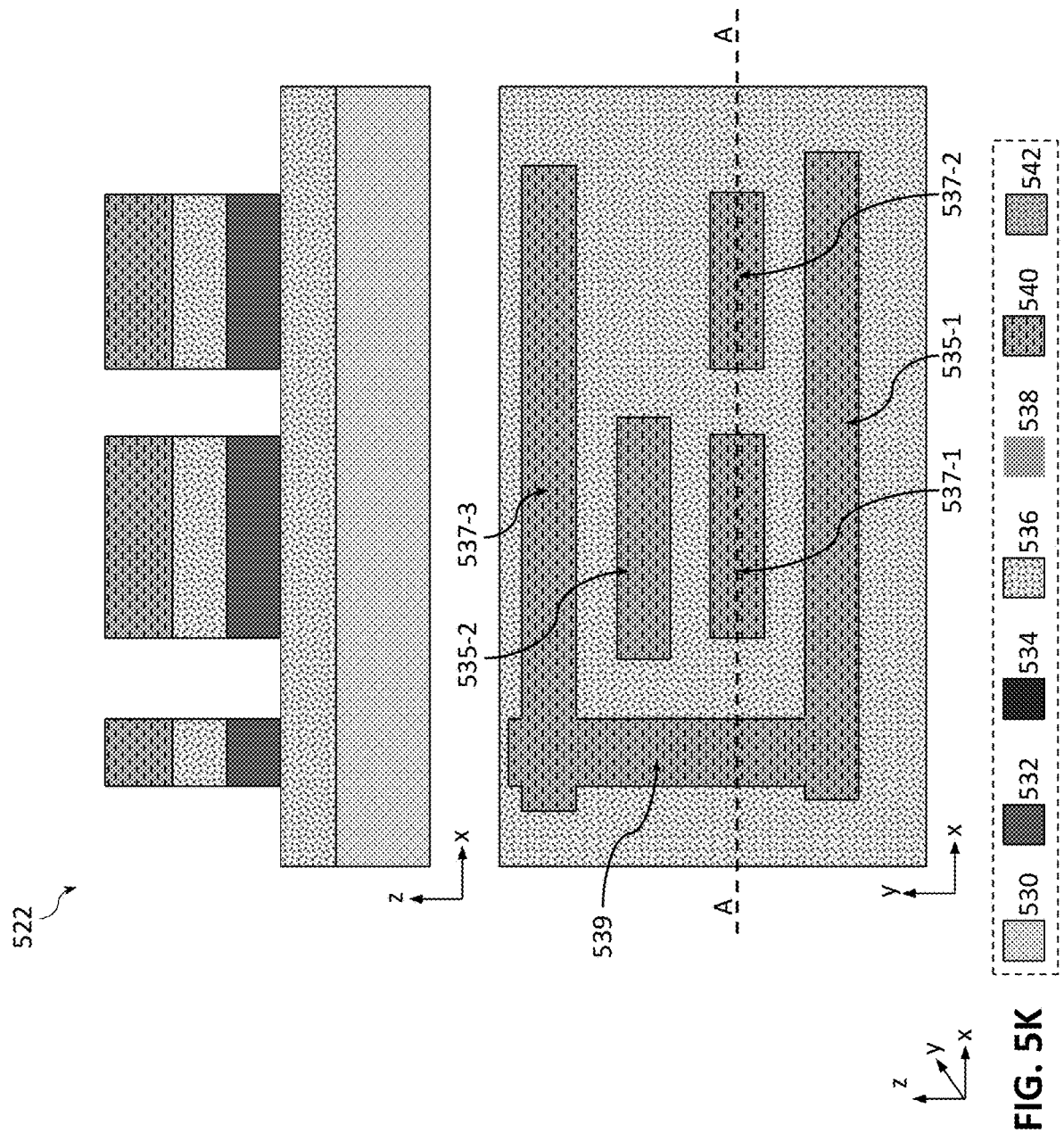

Next, the method 400 may proceed with the process 422 that may include performing metal etch to remove the electrically conductive material of the metal layer 532 using the pattern of the sacrificial material 540 as a mask. An IC structure 522, depicted in FIG. 5K, illustrates an example result of the process 422. The IC structure 522 illustrates the IC structure 520 where the electrically conductive material of the metal layer 532 that is not covered by the sacrificial material 540 has been removed, e.g., using anisotropic etch such as RIE. Thus, the pattern of the sacrificial material 540 may act as a mask for removing the electrically conductive material of the metal layer 532 in the process 422. In some embodiments, the process 422 may include any suitable etching process that can remove the electrically conductive material of the metal layer 532 without substantially etching other portions of the IC structure 522. To that end, in some embodiments, the electrically conductive material of the metal layer 532 may be a material that is etch-selective with respect to the sacrificial material 540. In other embodiments, the electrically conductive material of the metal layer 532 may be a material that is not etch-selective with respect to the sacrificial material 540, as long as it is etch-selective with respect to the dielectric material 536.

Figure 5L:
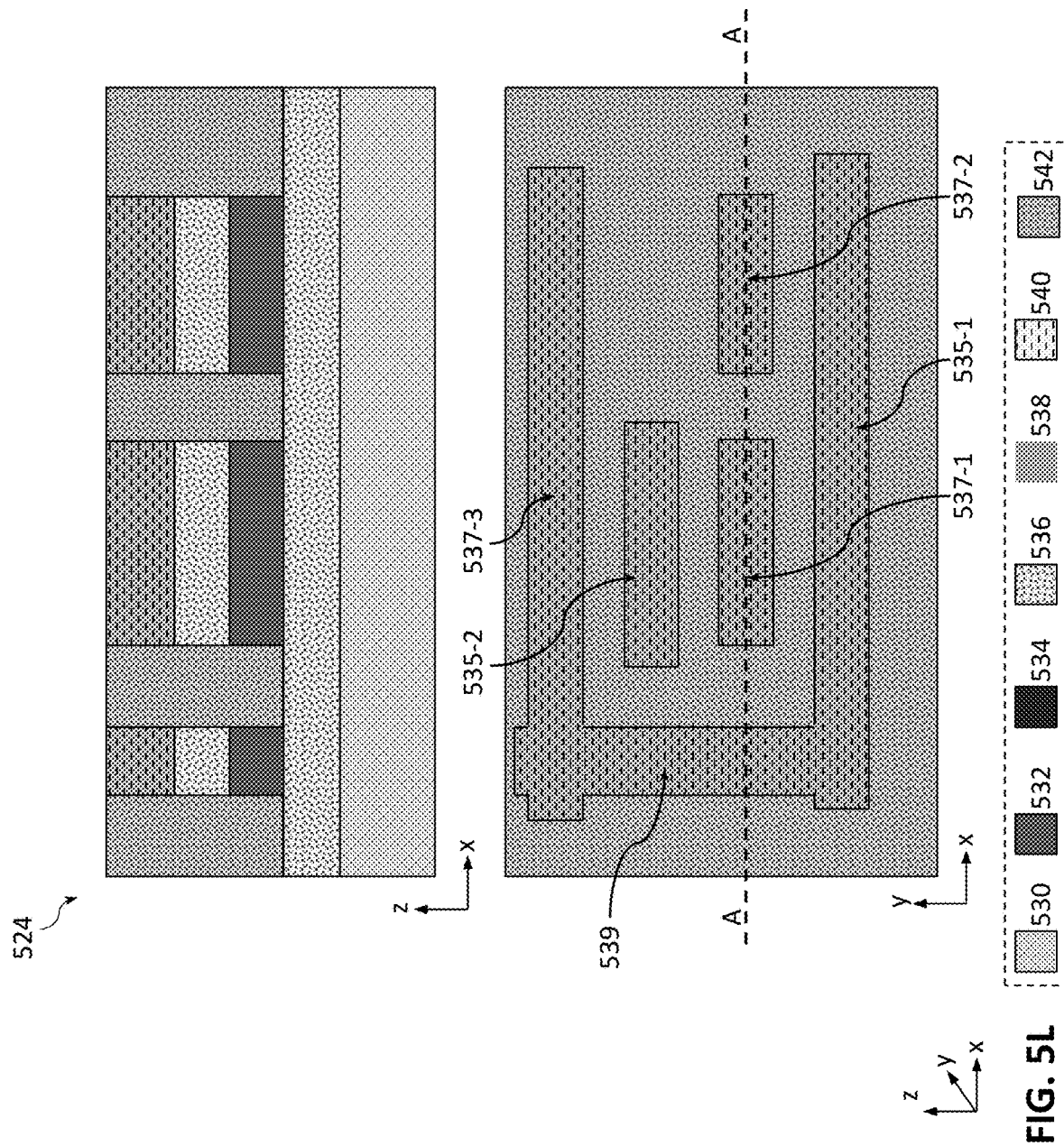

As also shown in FIG. 4B, the method 400 may include the process 424 of depositing a further dielectric material over the IC structure 522 and removing excess of the further dielectric material to reveal the sacrificial material 540. An IC structure 524, depicted in FIG. 5L, illustrates an example result of the process 424. The IC structurer 524 illustrates a further dielectric material 542 over all of the elements of the IC structure 522. The further dielectric material 542 may, e.g., include any of the dielectric materials described above and may be deposited using the methods for depositing dielectric materials, described above. The excess of the further dielectric material 542 may be removed using a suitable polishing technique, such as CMP. In some embodiments, the further dielectric material 542 may be a material that it etch-selective with respect to the electrically conductive material of the metal layer 532.

As further shown in FIG. 4B, the method 400 may conclude with the process 426 that includes removing the sacrificial material 540 and the dielectric material 536 that may be present over the metal layer 532 to reveal the pattern in the metal layer 532. An IC structure 526, depicted in FIG.

5M, illustrates an example result of the process 426. The IC structurer 526 illustrates that the openings 535, 537, and 539 have been transferred to the metal layer 532 in that the metal layer 532 has been patterned to form structures 545, 547, and 549 of the electrically conductive material of the metal layer 532 that have locations and geometry defined by the locations and geometry of the openings 535, 537, and 539.

The structures 545, 547, and 549 of the electrically conductive material of the metal layer 532 form an interconnect arrangement for which stitching was used. In particular, the structures 545-1 and 545-2 are examples of the first metal lines 102 in two different tracks as described herein, e.g., in tracks 1 and 3, respectively. Further, the structures 547-1, 547-2, and 547-3 are examples of the second metal lines 104 in two different tracks as described herein, e.g., with the structures 547-1 and 547-2 being in track 2 and the structure 547-3 being in track 4. Finally, the structure 549 is an example of the stitch 106 as described herein, providing a jog between the first metal line 102 of track 1 formed by the structure 545-1 and the second metal line 104 of track 4 formed by the structure 547-3.

The method 400 may be used to realize any of the interconnect arrangements described with reference to FIGS. 1, 2, and 3.

Example Devices

The IC structures with interconnect arrangements where stitching was used, disclosed herein, may be included in any suitable electronic device. FIGS. 6-9 illustrate various examples of apparatuses that may include one or more of the interconnect arrangements disclosed herein.

Figures 6A, 6B:
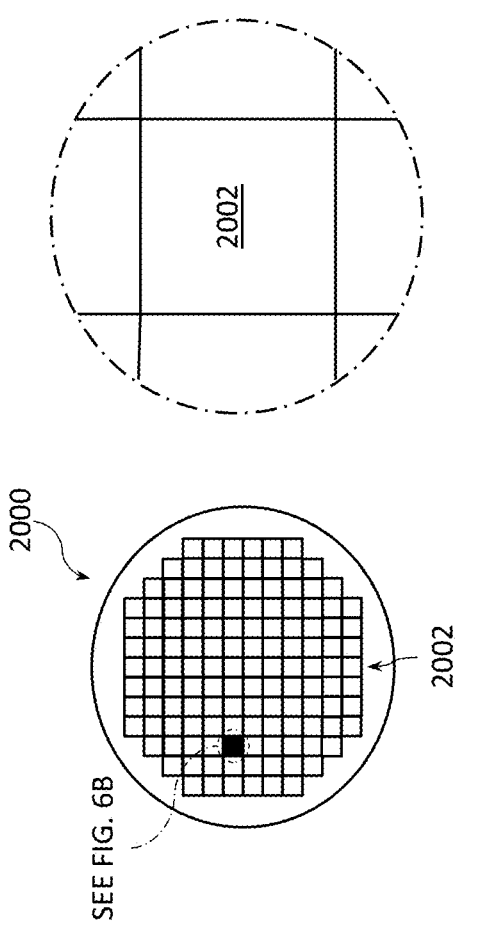
FIGS. 6A and 6B are top views of, respectively, a wafer and dies that may include one or more interconnect arrangements where stitching was used, in accordance with various embodiments.

FIGS. 6A-6B are top views of a wafer 2000 and dies 2002 that may include one or more interconnect arrangements where stitching was used to enable dense interconnect arrangements in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 7. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more interconnect arrangements where stitching was used as described herein). After the fabrication of the semiconductor product is complete (e.g., after manufacture of one or more layers of the interconnect arrangements where stitching was used as described herein), the wafer 2000 may undergo a singulation process in which each of the dies 2002 is separated from one another to provide discrete "chips" of the semiconductor product. In particular, devices that include one or more interconnect arrangements where stitching was used as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., an SRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 9) or other logic that is configured to store information in the memory devices or execute instructions stored in the memory array.

Figure 7:
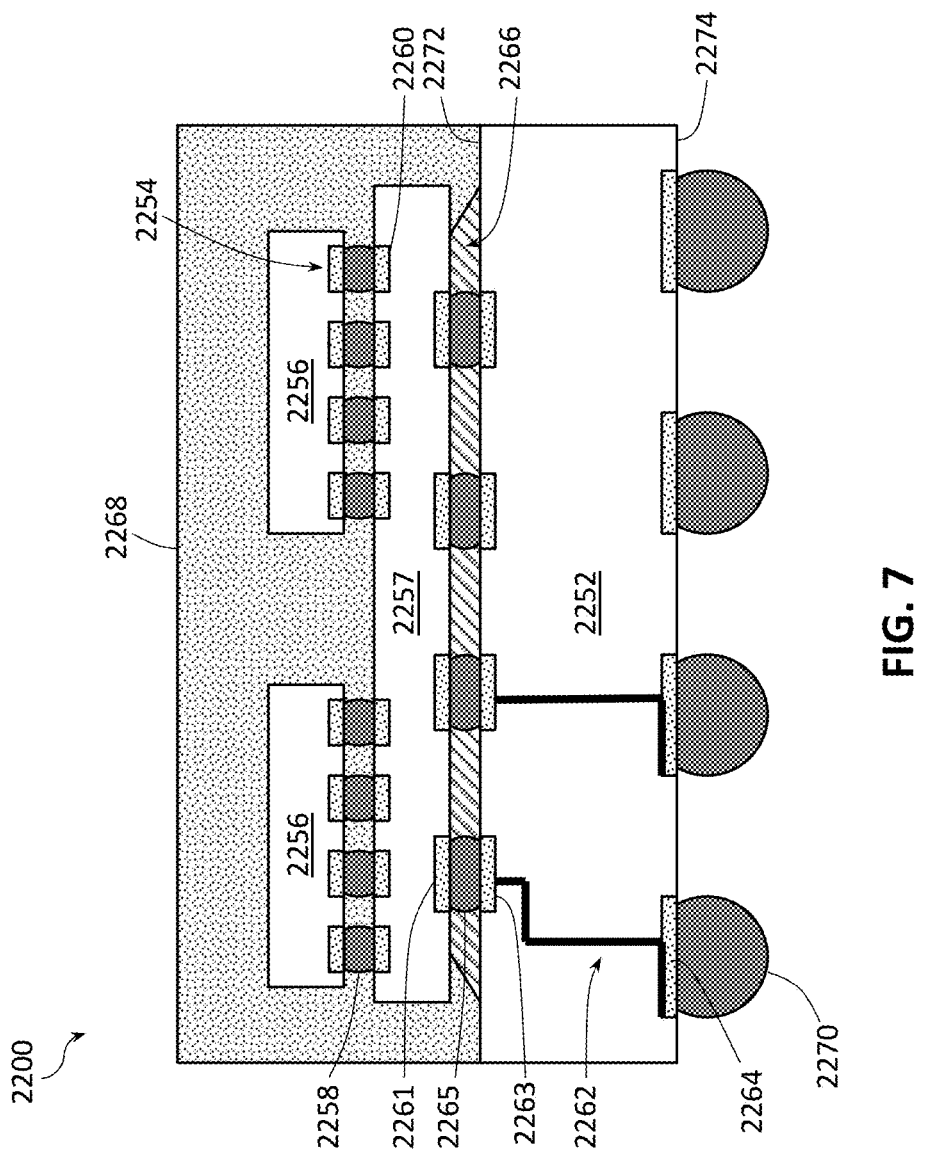
FIG. 7 is a cross-sectional side view of an IC package that may include one or more interconnect arrangements where stitching was used, in accordance with various embodiments.

FIG. 7 is a side, cross-sectional view of an example IC package 2200 that may include one or more interconnect arrangements where stitching was used to enable dense interconnect arrangements in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 7 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 7 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 7 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 8.

The dies 2256 may take the form of any of the embodiments of the die 2002 discussed herein (e.g., may include any of the embodiments of the interconnect arrangements where stitching was used as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory). In some embodiments, any of the dies 2256 may include one or more interconnect arrangements where stitching was used as discussed above; in some embodiments, at least some of the dies 2256 may not include any interconnect arrangements where stitching was used.

The IC package 2200 illustrated in FIG. 7 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 7, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 8:
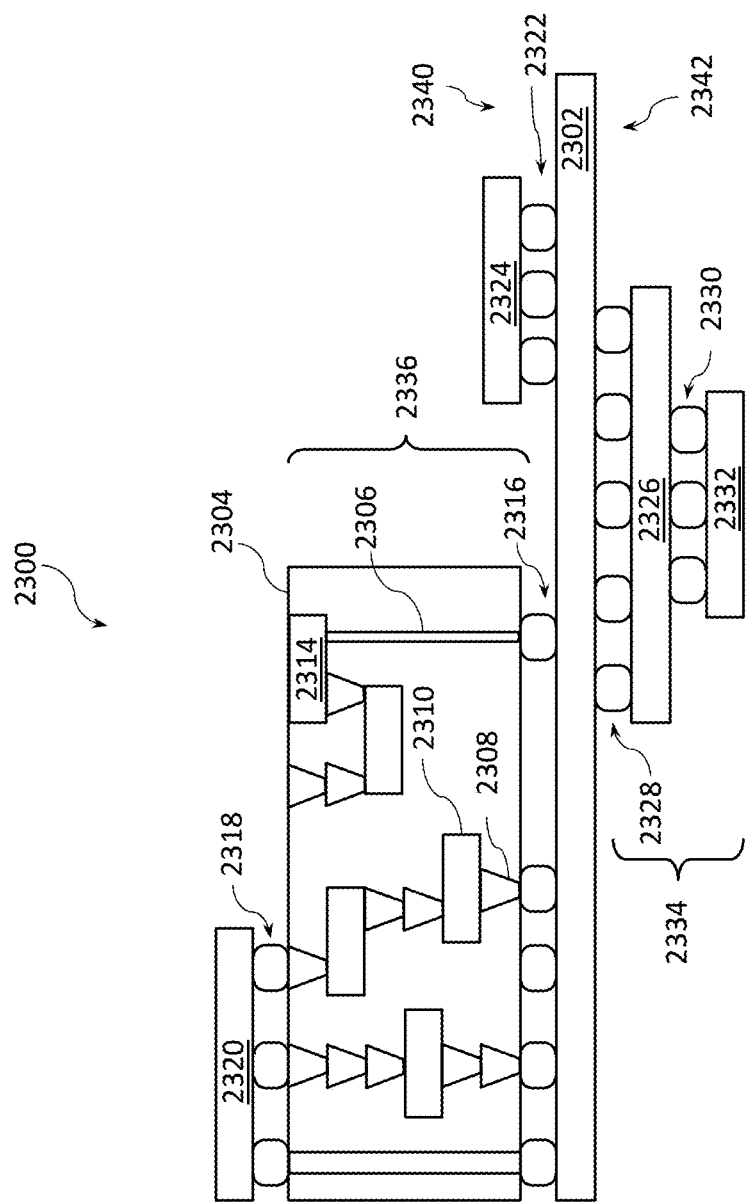
FIG. 8 is a cross-sectional side view of an IC device assembly that may include one or more interconnect arrangements where stitching was used, in accordance with various embodiments.

FIG. 8 is a cross-sectional side view of an IC device assembly 2300 that may include components having one or more interconnect arrangements where stitching was used to enable dense interconnect arrangements in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more interconnect arrangements where stitching was used in accordance with any of the embodiments disclosed herein; e.g., any of the IC packages discussed below with reference to the IC device assembly 2300 may take the form of any of the embodiments of the IC package 2200 discussed above with reference to FIG. 7 (e.g., may include one or more interconnect arrangements where stitching was used provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 8 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 8), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 6B), an IC device, or any other suitable component. In particular, the IC package 2320 may include one or more interconnect arrangements where stitching was used as described herein. Although a single IC package 2320 is shown in FIG. 8, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 8, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include any number of metal lines 2310, vias 2308, and through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 8 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 9:
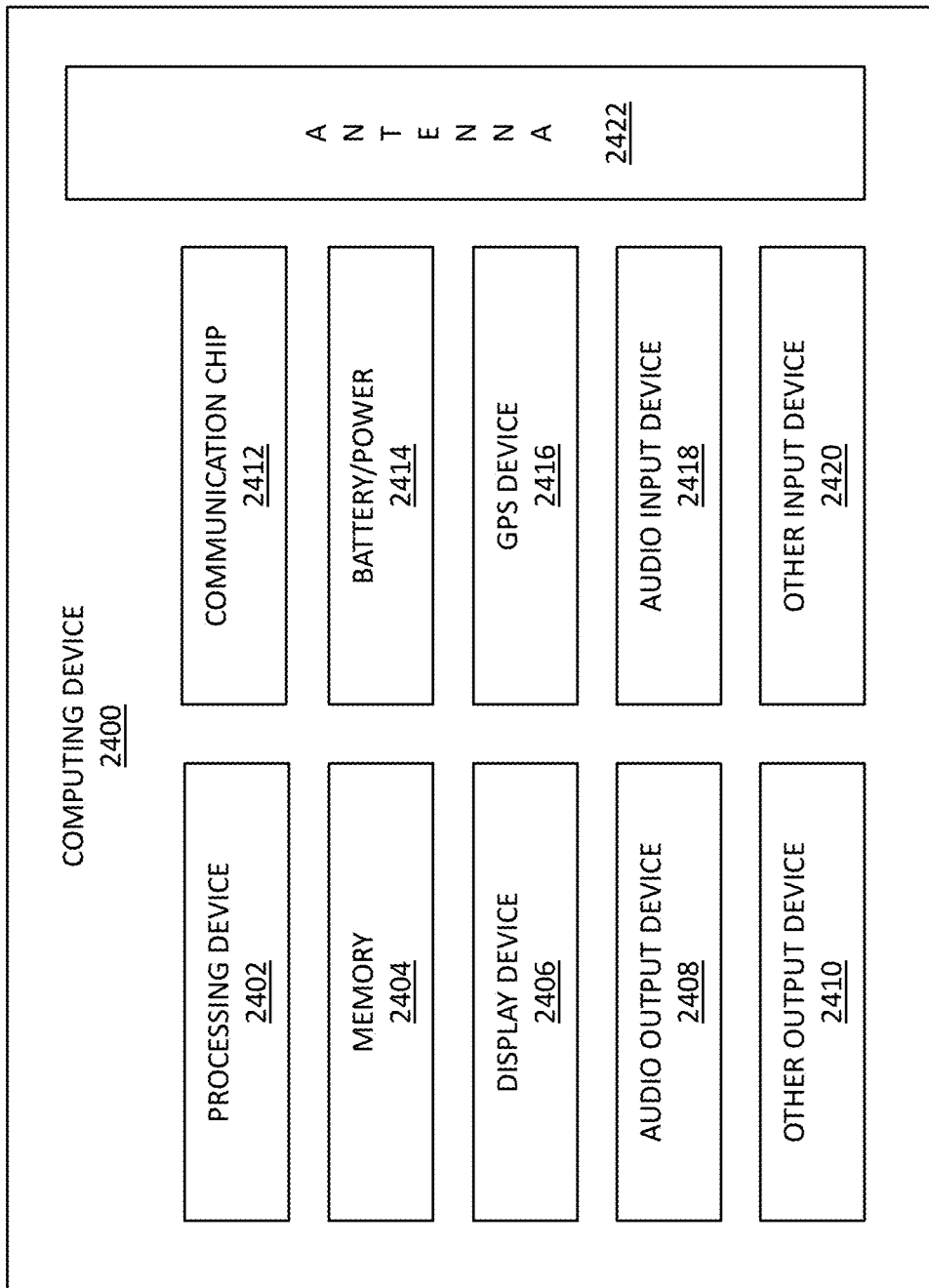
FIG. 9 is a block diagram of an example computing device that may include one or more interconnect arrangements where stitching was used, in accordance with various embodiments.

FIG. 9 is a block diagram of an example computing device 2400 that may include one or more components with one or more interconnect arrangements where stitching was used to enable dense interconnect arrangements in accordance with any of the embodiments disclosed herein. For example, any suitable ones of the components of the computing device 2400 may include a die (e.g., the die 2002, shown in FIG. 6B) including one or more interconnect arrangements where stitching was used in accordance with any of the embodiments disclosed herein. Any of the components of the computing device 2400 may include an IC package 2200 (e.g., as shown in FIG. 7). Any of the components of the computing device 2400 may include an IC device assembly 2300 (e.g., as shown in FIG. 8).

A number of components are illustrated in FIG. 9 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system on a chip (SoC) die.

Additionally, in various embodiments, the computing device 2400 may not include one or more of the components illustrated in FIG. 9, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides am IC structure that includes a support structure (e.g., a support structure 522, shown in the present drawings, e.g., a substrate); a first electrically conductive line (i.e., an interconnect having a length that is substantially greater than its width or thickness) provided over the support structure; a second electrically conductive line provided over the support structure; and an electrically conductive stitch, having a first end that is coupled to the first electrically conductive line and having a second end that is coupled to the second electrically conductive line, where the first electrically conductive line, the second electrically conductive line, and the electrically conductive stitch are in a single plane (i.e., in a single metallization layer Mx) over the support structure, where the first and the second electrically conductive lines are substantially parallel to one another, and a misalignment between the first end of the electrically conductive stitch and the first electrically conductive line is between about 0.2 and 5 nanometers, including all values and ranges therein, e.g., between about 0.2 and 3 nanometers, or between about 0.5 and 3 nanometers.

Example 2 provides the interconnect arrangement according to example 1, where the misalignment between the first end of the electrically conductive stitch and the first electrically conductive line is a misalignment between the first end of the electrically conductive stitch and a first end of the first electrically conductive line.

Example 3 provides the interconnect arrangement according to example 2, where the misalignment is in the first end of the first electrically conductive line extending beyond a sidewall of the electrically conductive stitch.

Example 4 provides the interconnect arrangement according to example 2, where the misalignment is in a sidewall of the electrically conductive stitch extending beyond the first end of the first electrically conductive line.

Example 5 provides the interconnect arrangement according to any one of examples 2-4, where the misalignment is in a direction that is substantially parallel to a long axis of the first electrically conductive line (i.e., in a direction of the x-axis of the example coordinate system shown in FIGS. 1A-1D).

Example 6 provides the interconnect arrangement according to example 1, where the misalignment is in the first end of the electrically conductive stitch extending beyond a sidewall of the first electrically conductive line.

Example 7 provides the interconnect arrangement according to example 1, where the misalignment is in a sidewall of the first electrically conductive line extending beyond the first end of the electrically conductive stitch.

Example 8 provides the interconnect arrangement according to any one of examples 6-7, where the misalignment is in a direction that is substantially perpendicular to a long axis of the first electrically conductive line (i.e., the misalignment is in a direction of the y-axis of the example coordinate system shown in FIGS. 1A-1D).

Example 9 provides the interconnect arrangement according to any one of examples 1-8, where the first electrically conductive line is substantially parallel to the second electrically conductive line, and the electrically conductive stitch is substantially perpendicular to the first electrically conductive line.

Example 10 provides the interconnect arrangement according to any one of examples 1-8, where the first electrically conductive line is substantially parallel to the second electrically conductive line, and the electrically conductive stitch is at an angle between about 10 and 80 degrees with respect to the first electrically conductive line.

Example 11 provides the interconnect arrangement according to any one of examples 1-10, where the first electrically conductive line is substantially parallel and adjacent to the second electrically conductive line.

Example 12 provides the interconnect arrangement according to any one of examples 1-10, where the first electrically conductive line is substantially parallel to the second electrically conductive line, and the interconnect arrangement further includes N additional electrically conductive lines, where N is an integer greater than 0, each of which is substantially parallel to the first and the second electrically conductive lines, is in the single plane with the first and the second electrically conductive lines, and is between the first and the second electrically conductive lines.

Example 13 provides the interconnect arrangement according to any one of the preceding examples, where the first end of the electrically conductive stitch is coupled to a first end of the first electrically conductive line, the second end of the electrically conductive stitch is coupled to a first end of the second electrically conductive line, and the first electrically conductive line, the electrically conductive stitch, and the second electrically conductive line are arranged in a C-shape.

Example 14 provides an interconnect arrangement that includes a support structure (e.g., a substrate, a chip, or a wafer) and a metallization structure provided over the support structure, the metallization structure including an electrically conductive material having a shape that is a combination of a first line, a second line, and a stitch, provided in a single plane (i.e., in a single metallization layer Mx) over the support structure, where the second line is substantially parallel to the first line and provided at a non-zero distance from the first line, the stitch extends between a portion of the first line and a portion of the second line, the stitch having a first sidewall portion that overlaps with the portion of the first line and further having a second sidewall portion that overlaps with the portion of the second line, and a misalignment between a first end of the stitch and a first end of the first line is between about 0.2 and 5 nanometers, including all values and ranges therein, e.g., between about 0.2 and 3 nanometers, or between about 0.5 and 3 nanometers.

Example 15 provides the interconnect arrangement according to example 14, where a length of the first sidewall portion of the stitch (i.e., the part of the stitch that overlaps with the portion of the first line) is between about 10 and 2000 nanometers, including all values and ranges therein, e.g., between about 12 and 100 nanometers.

Example 16 provides the interconnect arrangement according to examples 14 or 15, where the misalignment is the first end of the first line extending beyond the first end of the stitch.

Example 17 provides the interconnect arrangement according to examples 14 or 15, where the misalignment is the first end of the stitch extending beyond the first end of the first line.

Example 18 provides a method of fabricating an interconnect arrangement. The method includes providing, over a support structure, a stack of a metal layer and a collection layer, so that the metal layer is between the support structure and the collection layer; performing a first lithographic process to provide, in the collection layer, first openings for a first set of lines; performing a second lithographic process to provide, in the collection layer, second openings for a second set of lines; performing a third lithographic process to provide, in the collection layer, a third opening for a stitch, where the third opening overlaps with at least one of the first openings and at least one of the second openings; and transferring the pattern of the first, second, and third openings to the metal layer.

Example 19 provides the method according to example 18, where performing the second lithographic process to provide the second openings includes performing a process that self-aligns the second openings with respect to the first openings.

Example 20 provides the method according to examples 18 or 19, where the third opening is misaligned with the at least one of the first openings or with the at least one of the second openings by about 0.2 to 5 nanometers, including all values and ranges therein, e.g., between about 0.2 and 3 nanometers, or between about 0.5 and 3 nanometers.

Example 21 provides the method according to any one of examples 18-20, where transferring the pattern of the at least one of the first openings to the metal layer provides a first electrically conductive line according to any one of examples 1-13, transferring the pattern of the at least one of the second openings to the metal layer provides a second electrically conductive line according to any one of examples 1-13, transferring the pattern of the third opening to the metal layer provides an electrically conductive stitch according to any one of examples 1-13, and the method further includes processes for fabricating the interconnect arrangement according to any one of examples 1-13.

Example 22 provides the method according to any one of examples 18-20, where transferring the pattern of the at least one of the first openings to the metal layer provides a first line according to any one of examples 14-17, transferring the pattern of the at least one of the second openings to the metal layer provides a second line according to any one of examples 14-17, transferring the pattern of the third opening to the metal layer provides a stitch according to any one of examples 14-17, and the method further includes processes for fabricating the interconnect arrangement according to any one of examples 14-17.

Example 23 provides an IC package that includes an IC die and a further IC component, coupled to the IC die. The IC die includes one or more interconnect arrangements according to any one of the preceding examples (e.g., each interconnect arrangement may be an interconnect arrangement according to any one of examples 1-17 and/or may be formed according to a method of any one of examples 18-22).

Example 24 provides the IC package according to example 23, where the further component is one of a package substrate, a flexible substrate, or an interposer.

Example 25 provides the IC package according to examples 23 or 24, where the further component is coupled to the IC die via one or more first-level interconnects.

Example 26 provides the IC package according to example 25, where the one or more first-level interconnects include one or more solder bumps, solder posts, or bond wires.

Example 27 provides a computing device that includes a circuit board; and an IC die coupled to the circuit board, where the IC die includes one or more of: one or more interconnect arrangements according to any one of the preceding examples (e.g., each interconnect arrangement may be an interconnect arrangement according to any one of examples 1-17 and/or may be formed according to a method of any one of examples 18-22), and the IC package according to any one of the preceding examples (e.g., the IC package according to any one of examples 23-26).

Example 28 provides the computing device according to example 27, where the computing device is a wearable computing device (e.g., a smart watch) or handheld computing device (e.g., a mobile phone).

Example 29 provides the computing device according to examples 27 or 28, where the computing device is a server processor.

Example 30 provides the computing device according to examples 27 or 28, where the computing device is a motherboard.

Example 31 provides the computing device according to any one of examples 27-30, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An interconnect arrangement, comprising:
a support structure;
a first electrically conductive line over the support structure;
a second electrically conductive line over the support structure; and
an electrically conductive stitch, having a first end that is coupled to the first electrically conductive line and having a second end that is coupled to the second electrically conductive line, wherein:
the first electrically conductive line, the second electrically conductive line, and the electrically conductive stitch are in a single plane over the support structure,
a misalignment between the first end of the electrically conductive stitch and the first electrically conductive line is between about 0.2 and 5 nanometers, wherein the misalignment results in a portion of the electrically conductive stitch extending beyond an edge of the first electrically conductive line,
the first electrically conductive line comprises respective portions on either side of the electrically conductive stitch, and the second electrically conductive line comprises respective portions on either side of the electrically conductive stitch, and
the first electrically conductive line, the electrically conductive stitch, and the second electrically conductive line are arranged in a C-shape, the C-shape comprising relatively longer portions of the respective portions of the first and the second electrically conductive lines.

2. The interconnect arrangement according to claim 1, wherein the misalignment between the first end of the electrically conductive stitch and the first electrically conductive line is a misalignment between the first end of the electrically conductive stitch and a first end of the first electrically conductive line, wherein the misalignment comprises a relatively shorter portion of the respective portions of the first electrically conductive line.

3. The interconnect arrangement according to claim 2, wherein the misalignment is in the first end of the first electrically conductive line extending beyond a sidewall of the electrically conductive stitch.

4. The interconnect arrangement according to claim 2, wherein the misalignment is in a sidewall of the electrically conductive stitch extending beyond the first end of the first electrically conductive line.

5. The interconnect arrangement according to claim 2, wherein the misalignment is in a direction that is substantially parallel to a long axis of the first electrically conductive line.

6. The interconnect arrangement according to claim 1, wherein the misalignment is in the first end of the electrically conductive stitch extending beyond a sidewall of the first electrically conductive line.

7. The interconnect arrangement according to claim 1, wherein the misalignment is in a sidewall of the first electrically conductive line extending beyond the first end of the electrically conductive stitch.

8. The interconnect arrangement according to claim 6, wherein the misalignment is in a direction that is substantially perpendicular to a long axis of the first electrically conductive line.

9. The interconnect arrangement according to claim 1, wherein:
the first electrically conductive line is substantially parallel to the second electrically conductive line, and
the electrically conductive stitch is substantially perpendicular to the first electrically conductive line.

10. The interconnect arrangement according to claim 1, wherein:
the first electrically conductive line is substantially parallel to the second electrically conductive line, and
the electrically conductive stitch is at an angle between about 10 and 80 degrees with respect to the first electrically conductive line.

11. The interconnect arrangement according to claim 1, wherein the first electrically conductive line is substantially parallel and adjacent to the second electrically conductive line.

12. The interconnect arrangement according to claim 1, wherein:
the first electrically conductive line is substantially parallel to the second electrically conductive line, and the interconnect arrangement further includes N additional electrically conductive lines, where N is an integer greater than 0, each of which:
is substantially parallel to the first and the second electrically conductive lines,
is in the single plane with the first and the second electrically conductive lines, and
is between the relatively longer portions of the respective portions of the first and the second electrically conductive lines.

13. An interconnect arrangement, comprising:
a support structure; and
a metallization structure over the support structure, the metallization structure including an electrically conductive material having a C-shape that comprises a first line, a second line, and a stitch in a single material layer over the support structure, wherein:
the second line is substantially parallel to the first line and at a distance from the first line,
the stitch extends between the first line and the second line, the stitch having a first sidewall portion that overlaps with the first line and further having a second sidewall portion that overlaps with the second line,
a misalignment between a first end of the stitch and a first end of the first line is between about 0.2 and 5 nanometers, wherein the misalignment results in a portion of the stitch extending beyond an edge of the first line,
the first line comprises respective portions on either side of the stitch, and the second line comprises respective portions on either side of the stitch, and
the C-shape comprises relatively longer portions of the respective portions of the first and the second lines.

14. The interconnect arrangement according to claim 13, wherein a length of the first sidewall portion of the stitch is between about 10 and 2000 nanometers.

15. The interconnect arrangement according to claim 13, wherein the misalignment is the first end of the first line extending beyond the first end of the stitch, wherein the misalignment comprises a relatively shorter portion of the respective portions of the first line.

16. The interconnect arrangement according to claim 13, wherein the misalignment is the first end of the stitch extending beyond the first end of the first line.

17. The interconnect arrangement according to claim 1, wherein the first electrically conductive line, the second electrically conductive line, and the electrically conductive stitch are in a single material layer over the support structure.

18. The interconnect arrangement according to claim 1, wherein:
   top surfaces of the first electrically conductive line, the second electrically conductive line, and the electrically conductive stitch are substantially coplanar, and
   bottom surfaces of the first electrically conductive line, the second electrically conductive line, and the electrically conductive stitch are substantially coplanar.

19. The interconnect arrangement according to claim 1, wherein a length of the misalignment is substantially equal to respective lengths of relatively shorter portions of the respective portions of the first and the second electrically conductive lines.

\* \* \* \* \*